(12) United States Patent
Reis

(10) Patent No.: US 6,377,475 B1
(45) Date of Patent: Apr. 23, 2002

(54) REMOVABLE ELECTROMAGNETIC INTERFERENCE SHIELD

(75) Inventor: Bradley E. Reis, Wilmington, DE (US)

(73) Assignee: Gore Enterprise Holdings, Inc., Newark, DE (US)

( * ) Notice: Subject to any disclaimer, the term of this patent is extended or adjusted under 35 U.S.C. 154(b) by 0 days.

(21) Appl. No.: 09/793,754

(22) Filed: Feb. 26, 2001

(51) Int. Cl.⁷ .................................................. H05K 9/00
(52) U.S. Cl. ..................... 361/818; 361/799; 361/800; 361/816; 174/35 R; 174/51
(58) Field of Search ................................ 361/799, 800, 361/801, 816, 818; 174/35 R, 51; 206/719

(56) References Cited

U.S. PATENT DOCUMENTS

| | | | |
|---|---|---|---|
| 5,148,265 A | 9/1992 | Khandros et al. | 357/80 |
| 5,148,266 A | 9/1992 | Khandros et al. | 357/80 |
| 5,153,379 A | 10/1992 | Guzuk et al. | 174/35 |
| 5,335,147 A | 8/1994 | Weber | 361/818 |
| 5,355,016 A | 10/1994 | Swirbel et al. | 257/659 |
| 5,367,434 A | 11/1994 | Griffin et al. | 361/719 |
| 5,495,399 A | 2/1996 | Gore et al. | 361/814 |
| 5,615,824 A | 4/1997 | Fjelstad et al. | 228/180.1 |
| 5,632,631 A | 5/1997 | Fjelstad et al. | 439/82 |
| 5,640,047 A | 6/1997 | Nakashima | 257/738 |
| 5,717,245 A | 2/1998 | Pedder | 257/691 |
| 5,748,455 A | 5/1998 | Phillips et al. | 361/818 |
| 5,759,047 A | 6/1998 | Brodsky et al. | 439/66 |
| 5,787,580 A | 8/1998 | Woo | 29/843 |
| 5,802,699 A | 9/1998 | Fjelstad et al. | 29/593 |
| 5,838,551 A | 11/1998 | Chan | 361/818 |
| 5,895,884 A | 4/1999 | Davidson | 174/35 |
| 5,939,784 A | 8/1999 | Glenn | 257/710 |
| 5,951,305 A | 9/1999 | Haba | 439/70 |
| 5,955,789 A | 9/1999 | Vendramin | 257/786 |
| 5,984,691 A | 11/1999 | Brodksy et al. | 439/66 |
| 6,010,340 A | 1/2000 | Campbell et al. | 439/71 |
| 6,027,346 A | 2/2000 | Sinsheimer et al. | 439/66 |
| 6,033,235 A | 3/2000 | Ikeya | 439/71 |
| 6,034,429 A | 3/2000 | Glenn et al. | 257/701 |
| 6,037,667 A | 3/2000 | Hembree et al. | 257/779 |
| 6,051,781 A | 4/2000 | Bianca et al. | 174/35 C |
| 6,058,018 A | 5/2000 | Gerrits et al. | 361/737 |
| 6,060,659 A | 5/2000 | Borowiec et al. | 174/35 R |
| 6,069,407 A | 5/2000 | Hamzehdoost | 257/774 |
| 6,069,482 A | 5/2000 | Hilton | 324/755 |
| 6,070,785 A | 6/2000 | Ameen et al. | 228/115 |

(List continued on next page.)

FOREIGN PATENT DOCUMENTS

| | | |
|---|---|---|
| EP | 1 008 414 A2 | 6/2000 |
| EP | 1 008 414 A3 | 8/2000 |
| WO | WO 00/13232 | 3/2000 |
| WO | WO 00/22674 | 4/2000 |

*Primary Examiner*—Jayprakash N. Gandhi
(74) *Attorney, Agent, or Firm*—Allan M. Wheatcraft

(57) ABSTRACT

An EMI shielded apparatus having a substrate with at least one electrical component disposed on it; a plurality of discrete electrically conductive fastening units disposed in a pattern on the substrate surrounding the at least one electrical component; a shield comprising a dielectric material layer having an inner surface and an outer surface and an electrically conductive layer over at least one of the inner and outer surface; a plurality of apertures formed in the shield such that the apertures correspond to the pattern of the electrically conductive fastening units; wherein at least one of the apertures has a contact region and wherein both the dielectric material layer and the electrically conductive layer of the shield at the contact region of the aperture are deflectable to the extent necessary to allow the contact region to engage and retain the electrically conductive fastening unit; and wherein the electrically conductive layer of the shield at the contact region is in electrical contact with the electrically conductive fastening unit.

28 Claims, 24 Drawing Sheets

U.S. PATENT DOCUMENTS

| | | | |
|---|---|---|---|
| 6,075,255 A | 6/2000 | Liao et al. | 257/48 |
| 6,095,842 A | 8/2000 | Lin | 439/342 |
| 6,097,609 A | 8/2000 | Kabadi | 361/760 |
| 6,097,964 A | 8/2000 | Nuovo et al. | 455/550 |
| 6,111,761 A | 8/2000 | Peana et al. | 361/818 |
| 6,126,455 A | 10/2000 | Haba | 439/70 |
| 6,126,467 A | 10/2000 | Ohashi | 439/268 |
| 6,136,131 A | 10/2000 | Sosnowski | 156/256 |
| 6,137,693 A | 10/2000 | Schwiebert et al. | 361/803 |
| 6,157,546 A | 12/2000 | Petty et al. | 361/816 |
| 6,166,918 A | 12/2000 | Olofsson et al. | 361/800 |
| 6,169,665 B1 | 1/2001 | Lepping et al. | 361/800 |
| 6,169,666 B1 | 1/2001 | Venant | 361/816 |
| 6,178,097 B1 | 1/2001 | Hauk, Jr. | 361/816 |
| 6,178,318 B1 | 1/2001 | Holmberg et al. | 455/300 |

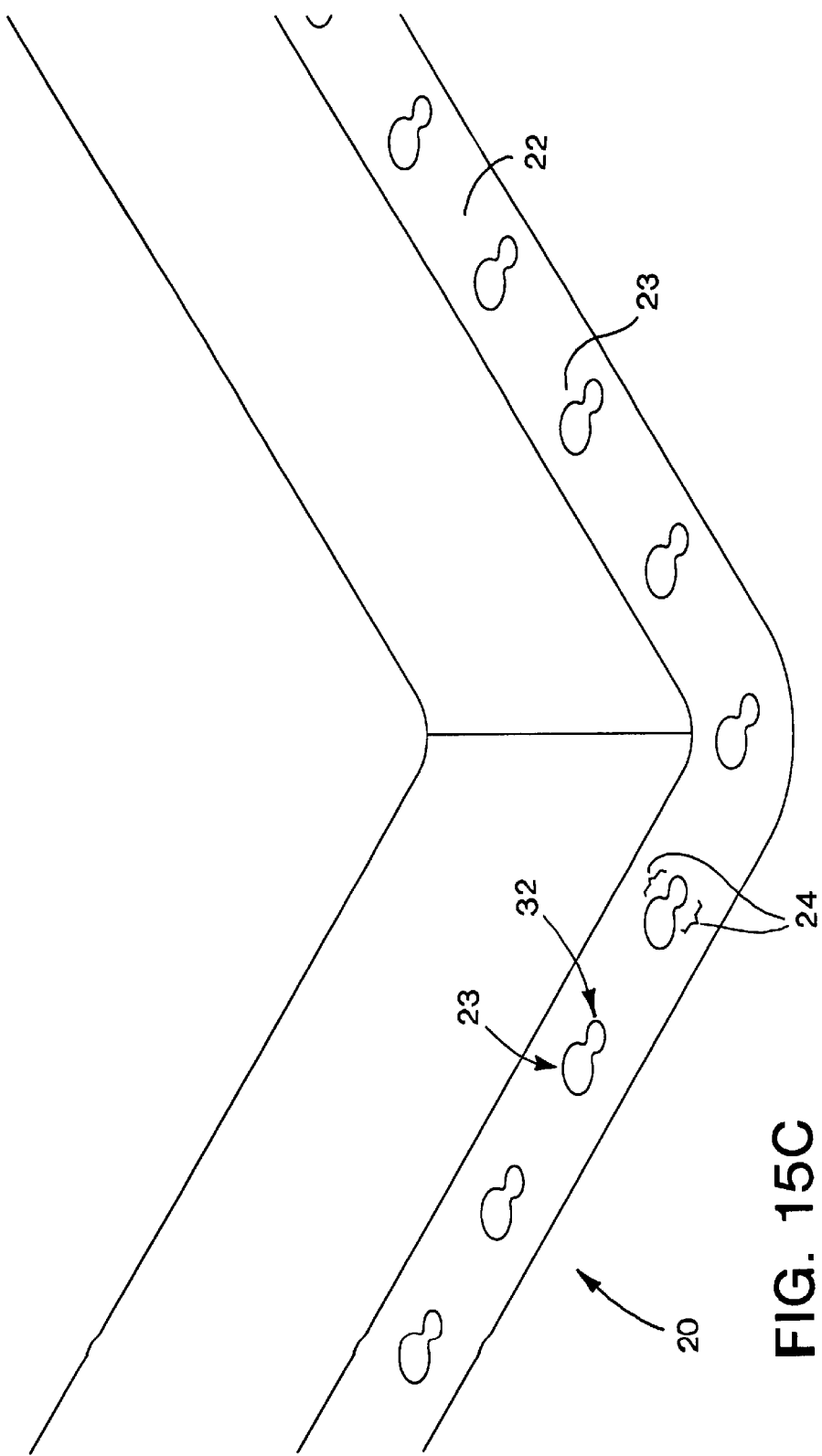

REMOVABLE ELECTROMAGNETIC INTERFERENCE SHIELD

FIELD OF THE INVENTION

This invention generally relates to an improved electromagnetic interference (EMI) shield. More particularly, the present invention relates to a shield that is easily removable, compatible with single or multi-compartment shield designs, thin in profile, lightweight, and low in cost. This solution is particularly advantageous for use in small electronic devices, such as cellular phones and laptop computers, among others.

BACKGROUND OF THE INVENTION

EMI shields limit electromagnetic radiation from entering or exiting sections of a printed circuit board (PCB) containing electronic components. A common type of EMI shield is known as a "can". A can is soldered to the ground trace on a PCB, directly over the electrical components that need to be shielded. Such cans offer extremely high levels of shielding effectiveness, and are typically very reliable. They are often installed in a fully automated fashion via a surface mount technology (SMT) process at the same time the components themselves are installed onto the PCB, using solder paste and a reflow process. The cans themselves are produced by stamping, drawing, folding, or other forming process, and are typically made from metal. This metal is often plated to enhance solderability and protect against oxidation or corrosion. A soldered can may be a very cost-effective solution for providing EMI shielding on a PCB, and is often the shielding method of choice for use in small portable devices such as cellular phones.

There are several drawbacks to using soldered cans, however. One such drawback is that cans are very difficult to remove, once soldered down to a PCB. This fact can prevent easy repairability or inspection of components underneath the cans, which can significantly add to costs in the manufacturing process or during repair. In addition, the cans may impede proper heat flow to these components during the reflow process, sometimes leading to improperly soldered joints. In addition to these issues, other problems with cans exist: they are difficult to produce in multi-compartment designs, where the compartments serve to isolate components or groups of components from each other on a PCB; they are typically relatively heavy since they are made of dense metals such as steel; they typically require clearance over the components they are covering, so they can add significantly to the overall thickness of the electronic package; they are difficult to make with tight flatness tolerances, especially as the cans become large, which can lead to soldering difficulties; they can be difficult to make with tight X-Y dimensional tolerances, which often forces the need for large, mating ground traces to solder to the cans. Cans thus can often consume large amounts of space on a PCB design, which is undesirable as cellular phones continue to get smaller and smaller.

To address problems with repairability of components, open-topped cans have been developed with snap-on or adhesive-backed lids. Such cans are often referred to as 'fences' or 'walls' and are affixed to the PCB as a single part in a similar fashion to standard cans, with the lids attached to the fences either before or after the SMT process. An example is found in U.S. Pat. No. 6,169,665. Such removable lids are not always mechanically and electrically reliable, however, especially when made in multi-compartment designs. The multi-compartment, single-part fences are also costly and suffer from some of the same ground trace width and weight problems as cans without removable lids. In addition, flatness issues are of major concern to properly soldering these fences to the PCB, particularly as the compartments get large in size and number.

Other removable shields are used in the industry to resolve some of the issues associated with cans, particularly in multi-compartment designs. These solutions can take several different forms, but a commonly used multi-compartment shield is a metal or metallized plastic cover, fastened to the PCB with screws. Often, a conformable EMI gasket is required at the interface between the shield and the PCB (since solder is not used), to promote more uniform electrical contact across the joint. This type of shielding solution affords the designer much more flexibility in accommodating multi-compartment designs, and gives the benefit of easy accessibility to the PCB during the SMT and manufacturing process.

On the downside, such gasketed shielding solutions have problems of their own. Many screws or other removable fasteners are typically required to adequately compress the EMI gaskets. Thus, the shields must be made from stiff metal or plastic. These requirements add weight, thickness, extra loose parts, manufacturing time, and, ultimately, cost to such designs. The gaskets used with such shields are also subject to damage, which may often lead to short-circuits of nearby electrical components. It is also time-consuming, difficult, and expensive to install or remove all of the fasteners holding the shield in place.

U.S. Pat. No. 6,051,781 describes another type of shield that removably snaps into clips placed around the electrical components on a PCB. Because the clips snap around the edges of the shield, they can only accommodate a single compartment shield design, since internal compartment walls have no edge. These clips, since they are intricate in shape, can be extremely costly and are required in large numbers to provide proper shielding effectiveness in large, multi-compartment designs. In addition to cost, however, this device suffers from many of the same disadvantages mentioned above, such as ground trace width, thickness, and weight, among others.

What has not heretofore been provided, and what is needed, is a shield that is removable and yet compatible with single or multi-compartment designs, thin in profile, lightweight, and low in cost.

SUMMARY OF THE INVENTION

The present invention provides an apparatus having a substrate with at least one electrical component disposed on it; a plurality of discrete electrically conductive fastening units disposed in a pattern on the substrate surrounding the at least one electrical component; a shield comprising a dielectric material layer having an inner surface and an outer surface and an electrically conductive layer over at least one of the inner and outer surface; a plurality of apertures formed in the shield such that the apertures correspond to the pattern of the electrically conductive fastening units; wherein at least one of the apertures has a contact region and wherein both the dielectric material layer and the electrically conductive layer of the shield at the contact region of the aperture are deflectable to the extent necessary to allow the contact region to engage and retain the electrically conductive fastening unit; and wherein the electrically conductive layer of the shield at the contact region is in electrical contact with the electrically conductive fastening unit.

In another aspect, the present invention provides an electromagnetic interference (EMI) shield for a substrate having at least one electrical component disposed thereon and a plurality of discrete electrically conductive fastening units disposed in a pattern on the substrate surrounding the at least one electronic component, the EMI shield comprising: a dielectric material layer having an inner surface and an outer surface; an electrically conductive layer over at least one of the inner and outer surface; a plurality of apertures formed in the shield such that the apertures correspond to the pattern of the electrically conductive fastening units; wherein at least one of the apertures has a contact region and wherein both the dielectric material layer and the electrically conductive layer of the shield at the contact region of the aperture are deflectable to the extent necessary to allow the contact region to engage and retain the electrically conductive fastening unit; and wherein the electrically conductive layer of the EMI shield at the contact region is in electrical contact with the electrically conductive fastening unit.

In still another aspect, the invention provides an apparatus having a substrate with at least one electrical component disposed thereon; a plurality of discrete electrically conductive fastening units disposed in a pattern on the substrate surrounding the at least one electrical component; a shield consisting essentially of an electrically conductive material; a plurality of apertures formed in the shield such that the apertures correspond to the pattern of the electrically conductive fastening units; wherein at least one of the apertures has a contact region and wherein said electrically conductive material of said shield at the contact region is deflectable to the extent necessary to allow the contact region to engage and retain the electrically conductive fastening unit; and wherein the electrically conductive material of the shield at the contact region is in electrical contact with the electrically conductive fastening unit.

In yet another aspect, the invention provides an apparatus having a substrate with at least one electrical component disposed on it; a plurality of solder spheres disposed on the substrate surrounding the at least one electrical component; an EMI shield comprising at least one compartment adapted to cover the at least one electrical component, the EMI shield further comprising a dielectric material layer having an inner surface and an outer surface and an electrically conductive layer over at least one of the inner and outer surface; and wherein the electrically conductive layer of the EMI shield is in electrical contact with at least one of the solder spheres, and wherein the EMI shield and the solder spheres combine to limit electromagnetic radiation from entering or exiting the at least one compartment.

The invention also includes other aspects in which the electrically conductive fastening unit is a solder sphere, the substrate has a ground trace disposed on it and the solder sphere is soldered to the ground trace on the substrate, the solder sphere is in interference contact with the contact region of the shield, the electrically conductive layer is disposed on the outer surface of the dielectric material layer, the electrically conductive layer is selected from the group consisting of aluminum, tin, gold, nickel, silver, copper and combinations and alloys thereof, the electrically conductive layer is foil, the electrically conductive layer is formed by a process selected from the group consisting of sputtering, vacuum or vapor deposition, electroless plating, and electrolytic plating, the electrically conductive layer is a dielectric material containing conductive particles, the substrate has a plurality of electrical components and the shield comprises a plurality of compartments adapted to cover the plurality of electrical components, the shield has a plurality of apertures formed in it, where the apertures are formed as the electrically conductive fastening unit penetrates the shield. These aspects of the invention may be used in combination with one another or separately in the inventive devices mentioned above.

BRIEF DESCRIPTION OF THE DRAWING

FIG. 15C is a perspective view of a shield according to another exemplary embodiment of the invention.

DETAILED DESCRIPTION OF THE INVENTION

Figure 1:
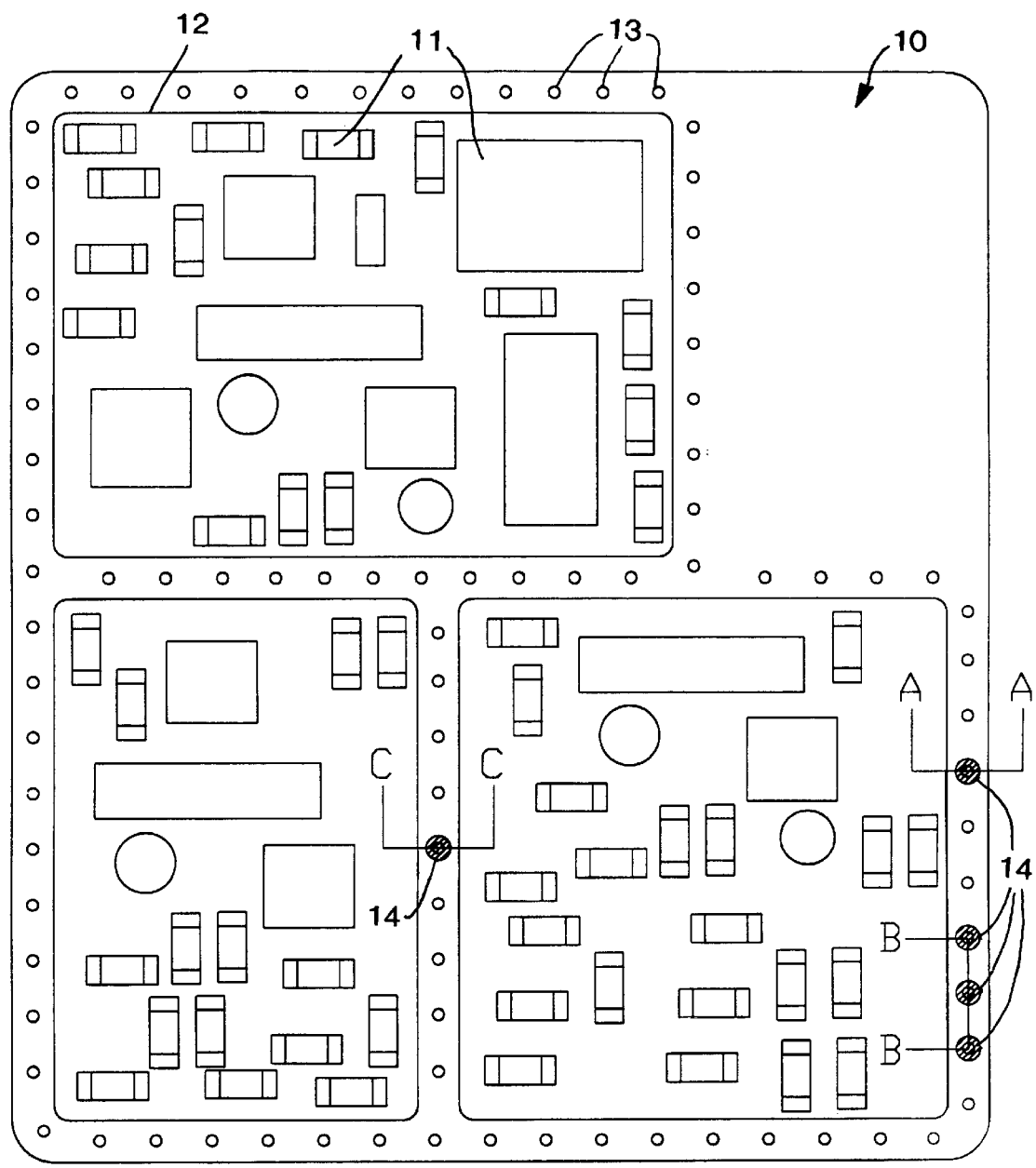
FIG. 1 is a plan view of a substrate according to an exemplary embodiment of the invention.

Referring now to the drawings, the present invention provides a repairable EMI shield wherein the shield is mechanically and electrically connected to a ground trace on a PCB, and yet is removable. FIG. 1 is a plan view of a PCB (10) according to an embodiment of this invention. PCB (10) is a substrate having a plurality of electrical components (11) grouped together in sections (12). Surrounding sections (12) are a plurality of ground trace pads (13). Disposed on each of ground trace pads (13) is an electrically conductive fastening unit (14). For ease of illustration, only some of ground trace pads (13) are shown to have electrically conductive fastening units (14) disposed on them, but it is preferable that all ground trace pads (13) have an electrically conductive fastening unit (14) disposed on them. A plurality of discrete electrically conductive fastening units (14) are thus disposed on PCB (10) in a pattern surrounding sections (12).

Figure 2A:
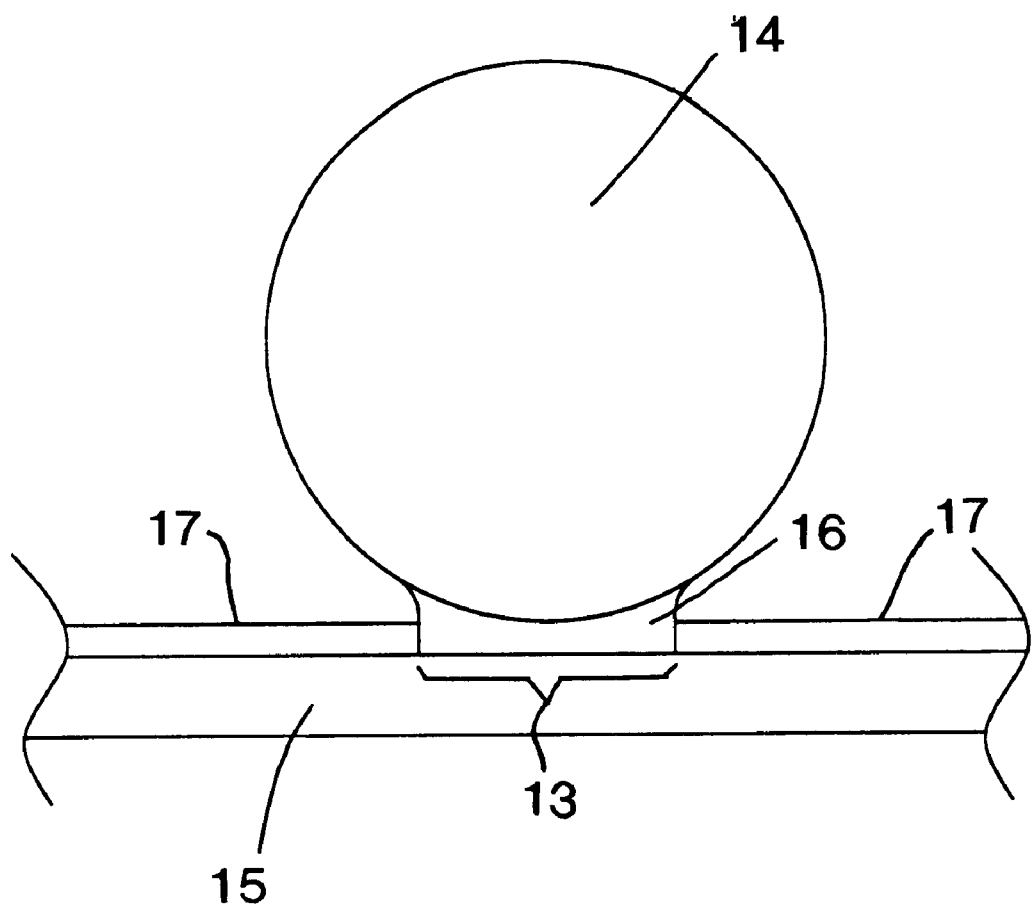
FIG. 2A is a side view of an electrically conductive fastening unit according to an exemplary embodiment of the invention.

FIG. 2A shows a detailed illustration of electrically conductive fastening unit (14). In the preferred embodiment, electrically conductive fastening unit (14) is a solder sphere as shown in FIG. 2A. If a solder sphere is used, it may be made of any alloy of solder, although it is preferably made from a high temperature solder metal so that it doesn't melt during subsequent processing. Such high temperature solder metal may be, for example, a metal having a high concentration of lead, a high concentration of tin and copper, a high concentration of tin and silver, and other known compositions.

Solder spheres, which are also known as solder balls, ball grid array (BGA) spheres, or BGA balls, are spheres of solder which are used as electrical and mechanical interconnects between two substrates (for example, a package and a PCB, a module and a PCB, or a PCB and another PCB). Traditionally, these interconnects are metallurgical bonds which are made during a reflow operation, wherein the two substrates are taken to a temperature above the melting point of the solder, in order to facilitate the flow and bonding of the solder to a surface on each of the substrates (package, module or PCB). Using this traditional reflow process, the metallurgical bond is meant to be permanent, both mechanically and electrically, at each of the two substrate surfaces to which the solder is bonded.

In the present invention, however, the solder sphere is metallurgically bonded only to the PCB. No metallurgical bond is created, however, between the sphere and the shield. Rather, as discussed in more detail below, the sphere is used to provide an interference fit with the shield.

While it is preferable that electrically conductive fastening unit (14) is a separate part, a discrete plurality of which are installed to the PCB like other electrical components using SMT, electrically conductive fastening unit (14) may alternatively be installed in a subsequent operation, or even formed in-situ. For example, if a solder sphere is used as electrically conductive fastening unit (14), the solder sphere may be formed in-situ by using solder-paste which has been stenciled in a pattern against ground trace (15) and subsequently sent through a reflow operation, forming a spherical shape from the solder through surface tension.

Figure 2B:
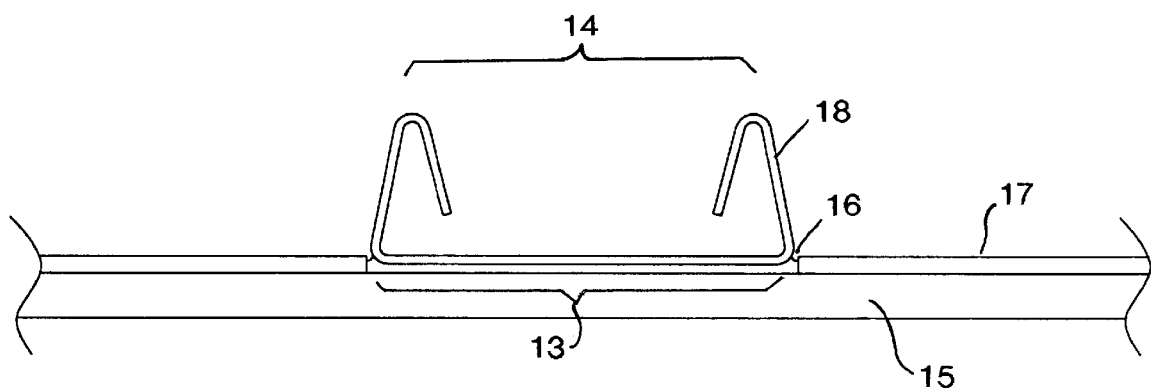
FIG. 2B is a side view of an electrically conductive fastening unit according to another exemplary embodiment of the invention.
Figure 2C:
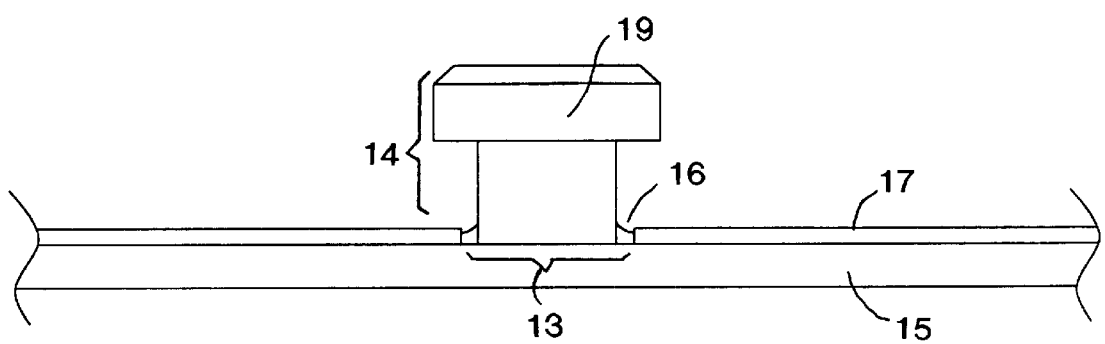
FIG. 2C is a side view of an electrically conductive fastening unit according to another exemplary embodiment of the invention.

In an alternative embodiment, electrically conductive fastening unit (14) is a clip (18) as shown in FIG. 2B or a mushroom-shaped button (19) as shown in FIG. 2C. Clip (18) or button (19) is a discrete device that may be applied using a standard SMT process, which is known to those skilled in the art. Electrically conductive fastening unit (14) may be any shape or material provided that it is electrically conductive, discrete, reliably mechanically and electrically attachable to a ground trace pad (13) on the PCB (10), and is also adapted to be removably mechanically and electrically attached to a shield, as discussed below.

Referring to FIGS. 2A, 2B and 2C, electrically conductive fastening unit (14) is adhered to a ground trace (15) by adhesive means (16). Preferably, adhesive means (16) is solder, but it may alternatively be a conductive adhesive, or other known adhesive means. Ground trace (15) is typically gold-plated copper. Tin, silver, or any other highly conductive metal is alternatively used for the plating or base layer, or both, of ground trace (15). A solder mask (17) is optionally used over ground trace (15) to contain adhesive means (16). Ground trace pads (13) are electrically connected to each other, and are the pattern formed by solder mask (17) over continuous ground trace (15), or the sections of a ground trace (15) which are remaining after portions of the continuous ground trace (15) which are removed during PCB fabrication. Preferably, ground trace pads (13) are circular in shape when used with electrically conductive fastening units (14) which are solder spheres or buttons (19). Alternatively, the ground trace pads (13) may be rectangular in shape, when used with electrically conductive fastening units (14) which are clips (18). When ground trace pads (13) are circular, it is desirable that this circular shape have a diameter smaller than the diameter of, for example, the solder sphere itself, but any shape or size pad may be used if tolerances are not critical. This shape will have some effect on the strength of the joint between the ground trace (15) and the solder sphere, as well as affecting the mechanical and electrical reliability of the joint between shield (20) and electrically conductive fastening unit (14) as described below, so it should be selected only after careful consideration and trials. Keeping the solder (16) in a small, confined area using solder mask (17) is desirable, however, since it allows the invention to take full advantage of the phenomenon of surface tension of solder, which tends to give the electrically conductive fastening unit (14) a self-centering capability, aligning it to the exposed ground trace pad (13).

Depending on the electrical and mechanical requirements of the design, the spacing and position of both the ground trace pads (13) and discrete electrically conductive fastening units (14) may be changed. Using smaller spacing between the ground trace pads (13), and correspondingly between the electrically conductive fastening units (14) will result in better high frequency EMI shielding (as described below) and better mechanical retention of shield (20) once it is installed over PCB (10).

Figure 3:
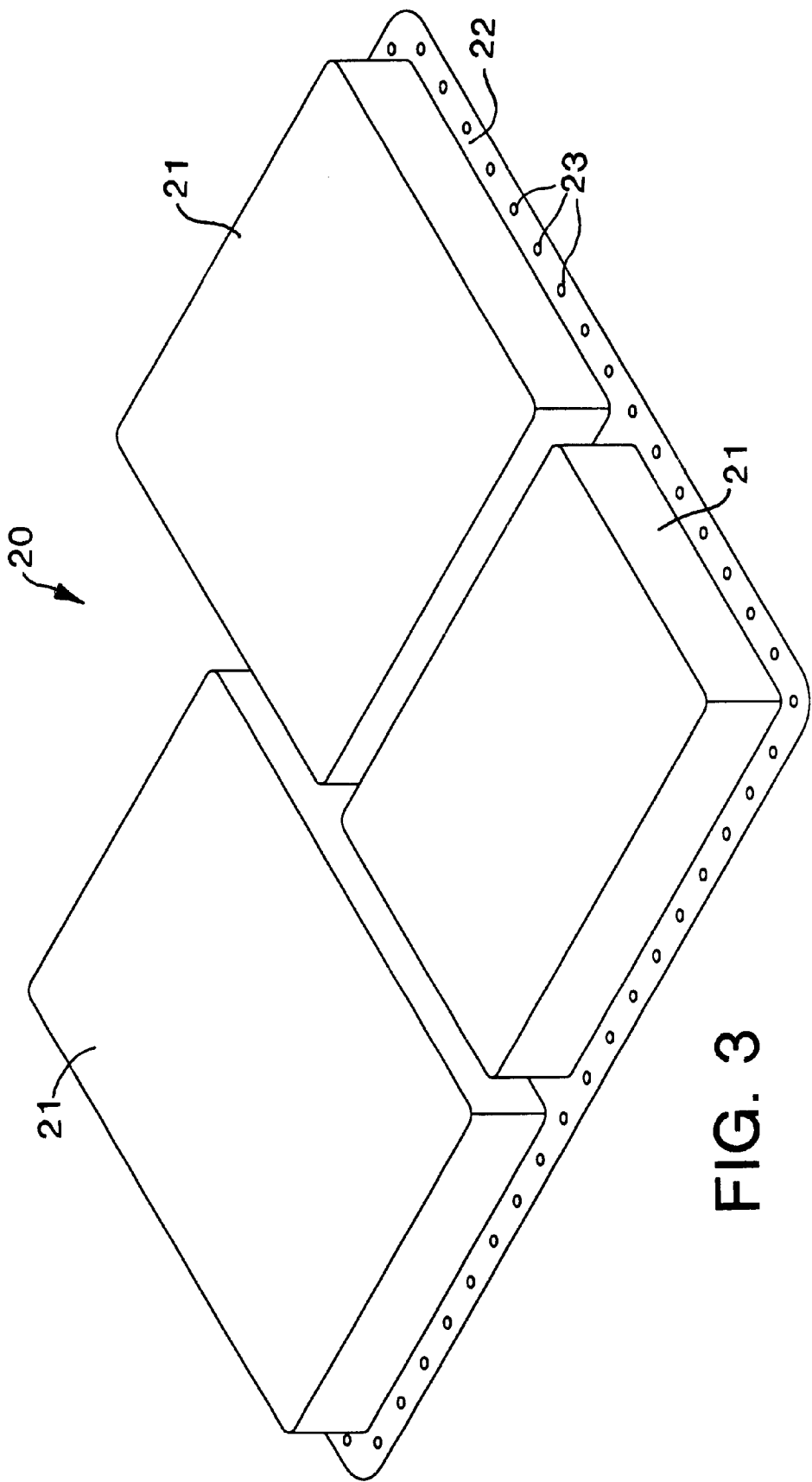
FIG. 3 is a perspective view of a shield according to an exemplary embodiment of the invention.

FIG. 3 illustrates a shield (20) according to an exemplary embodiment of the invention. Shield (20) has compartments (21) adapted to cover sections (12) on PCB (10). Shield (20) has a flange (22) containing a plurality of apertures (23). Apertures (23) are also formed in shield (20) between compartments (21). Apertures (23) form a pattern corresponding to the pattern formed by electrically conductive fastening units (14) such that there is an aperture (23) adapted to mate with each (or substantially each) electrically conductive fastening unit (14).

Figure 4:
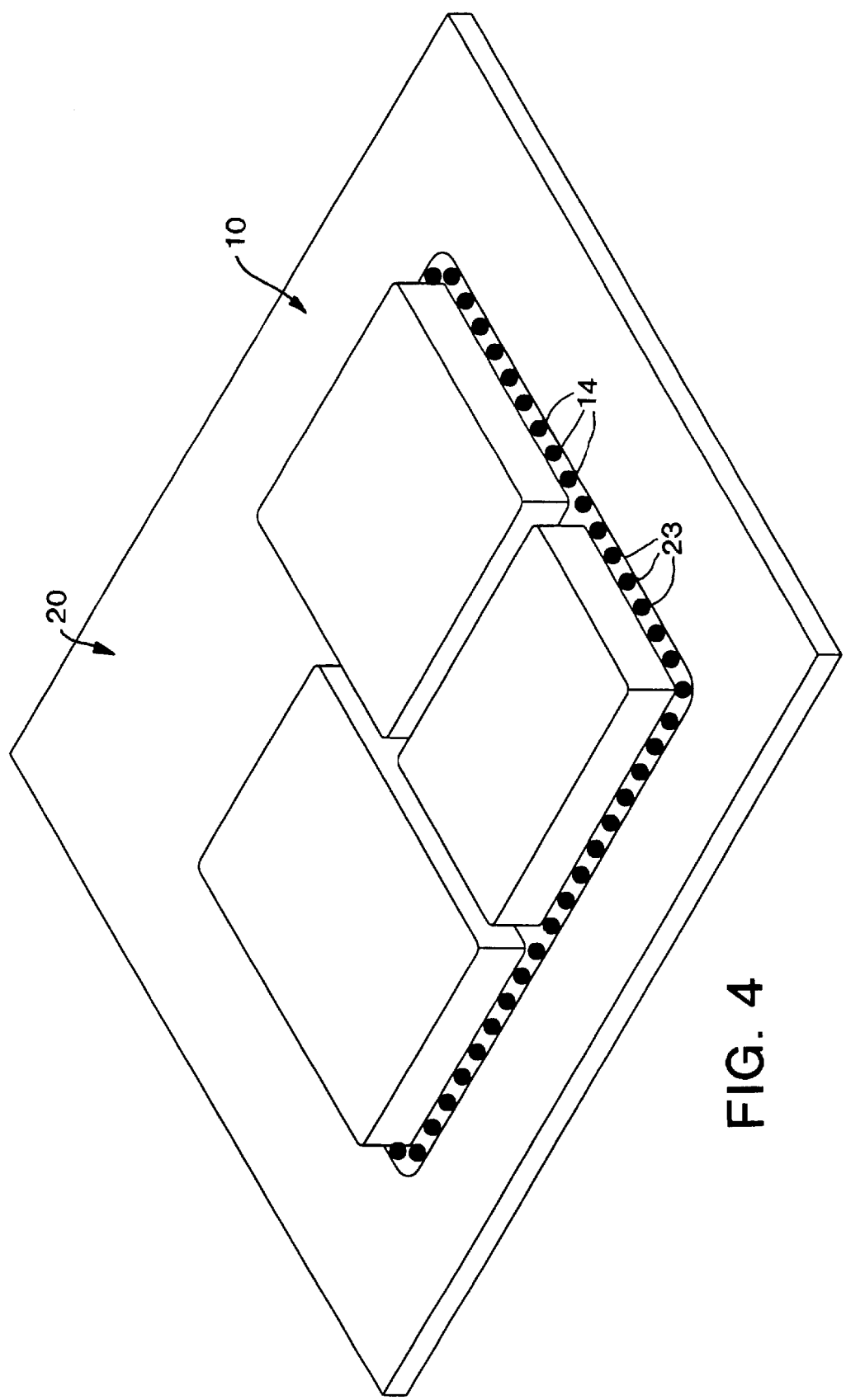
FIG. 4 is a perspective view of an apparatus according to an exemplary embodiment of the invention.

Shield (20) is placed over PCB (10) and attached to it as shown in FIG. 4. FIG. 4 shows electrically conductive fastening units (14) protruding through apertures (23) to provide a secure mechanical attachment of shield (20) to PCB (10). The diameter of each aperture (23) is preferably less than the greatest width of electrically conductive fastening unit (14) (for example, less than the diameter of a solder sphere). Because electrically conductive fastening units (14) are larger than apertures (23), the attachment creates a snap or interference fit which may be easily released by pulling shield (20) away from PCB (10). Shield (20) is thus removably attached to PCB (10).

When shield (20) is in place over PCB (10) with electrically conductive fastening units (14) snap-fit into apertures (23), an EMI shield is created around components (11) in section (12), as described below. This prevents or limits unwanted electromagnetic radiation from entering or exiting section (12).

Figure 5:
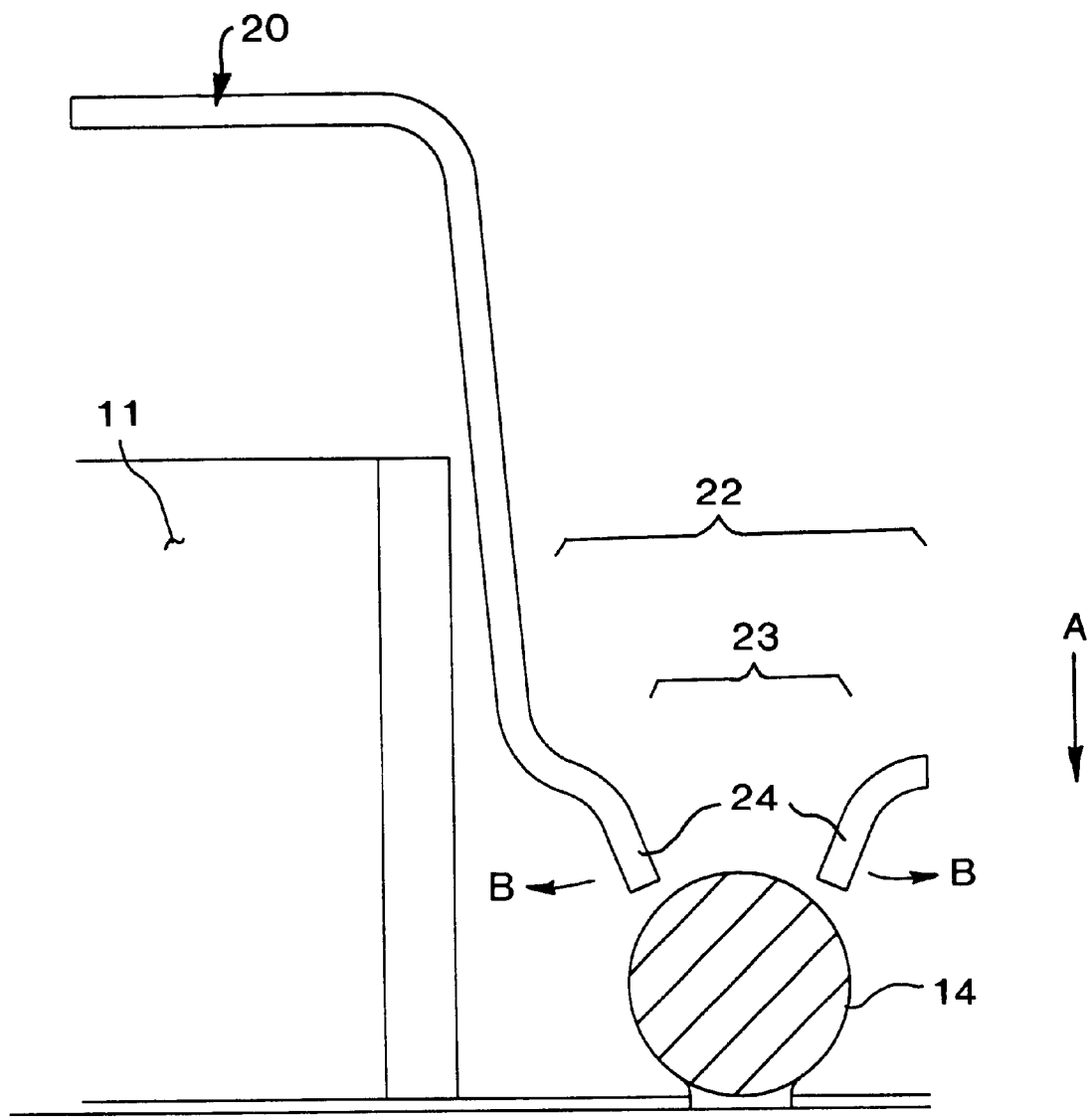
FIG. 5 is a cross-sectional view taken along A—A of FIG. 1.
Figure 6:
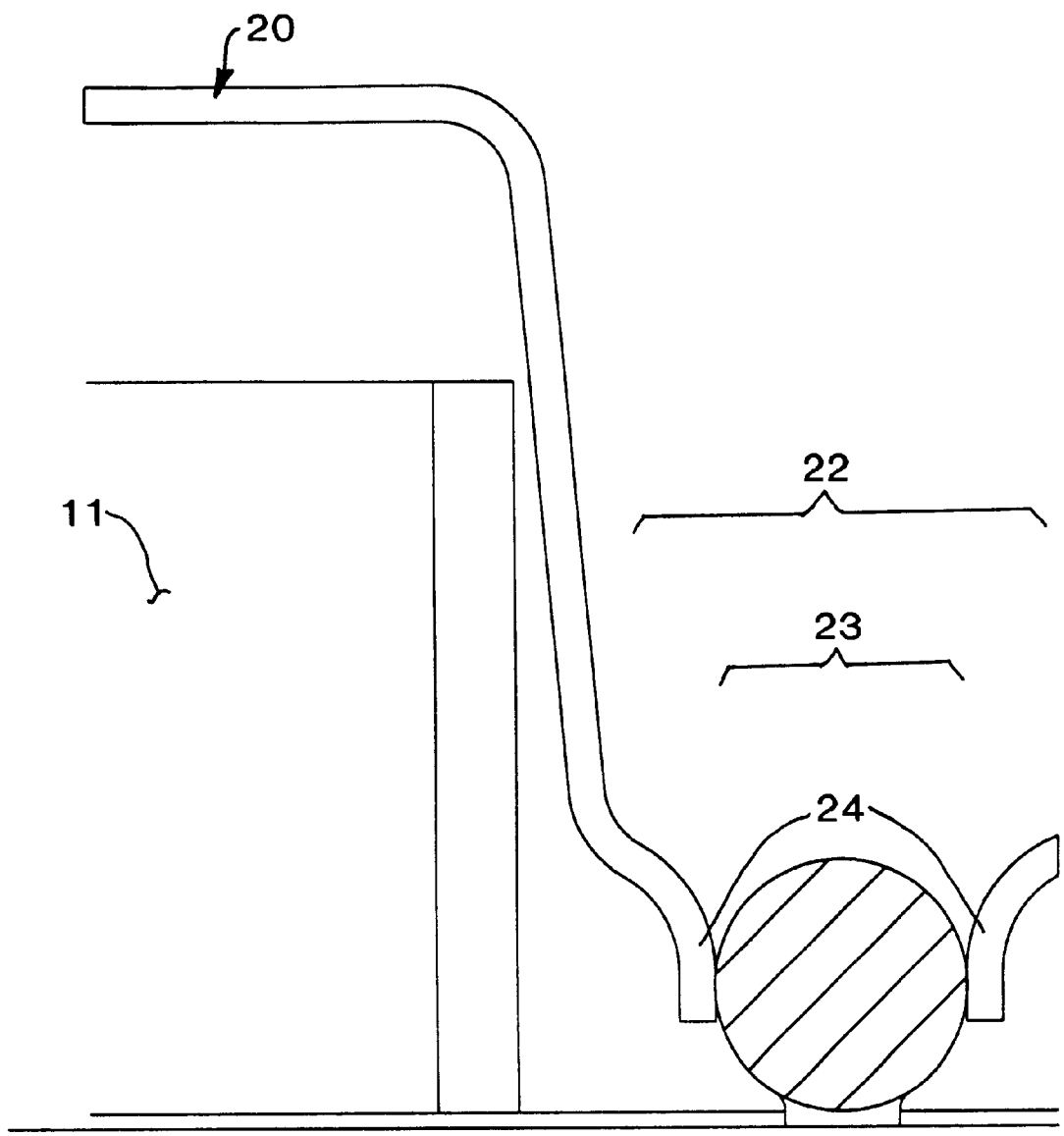
FIG. 6 is a cross-sectional view taken along A—A of FIG. 1.
Figure 7:
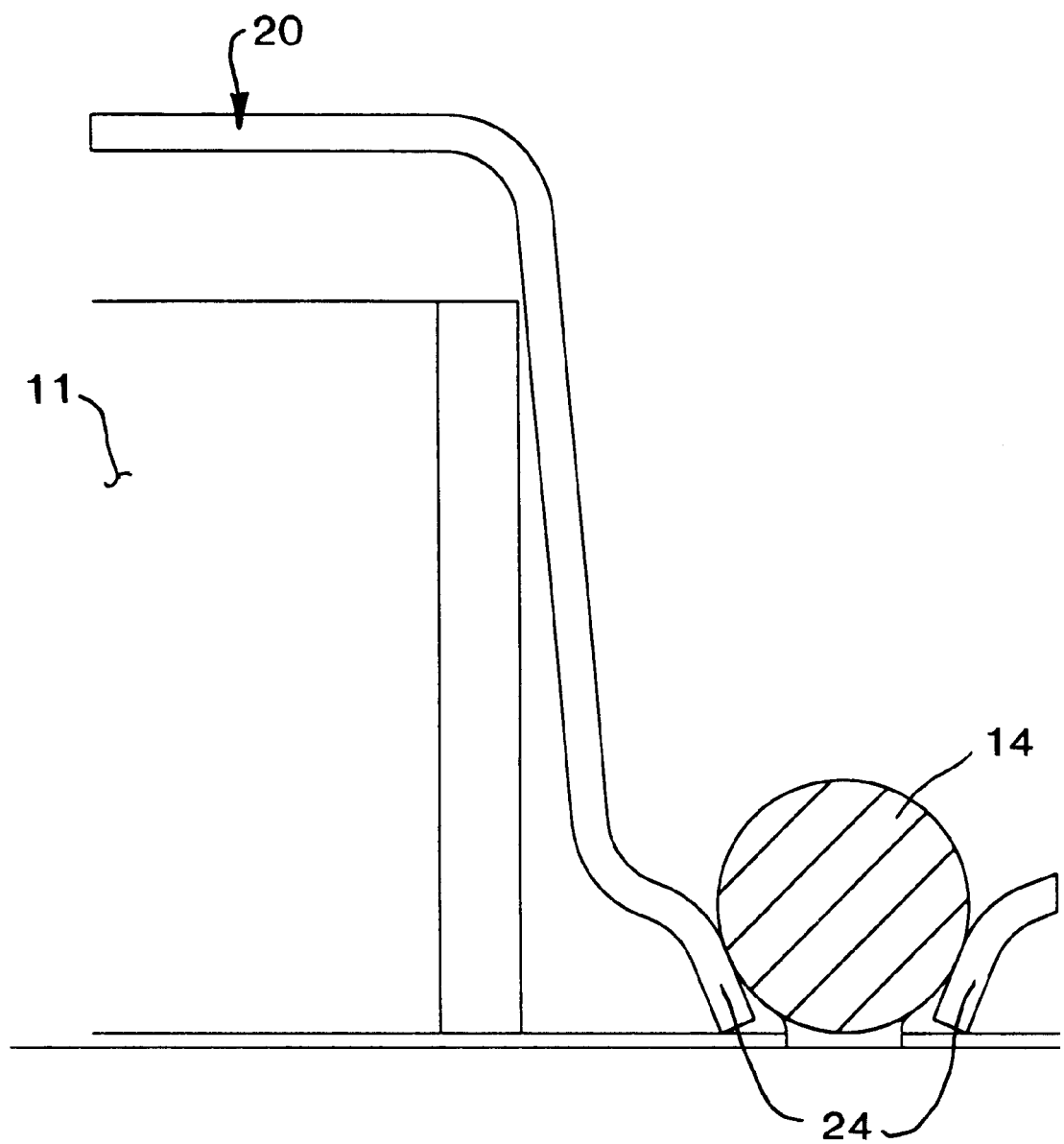
FIG. 7 is a cross-sectional view taken along A—A of FIG. 1.

FIG. 5 shows a detailed cross-sectional view in a preferred embodiment of flange (22) and aperture (23) (taken along A—A of FIG. 1) which represents an external compartment wall of shield (20) immediately before shield (20) is snapped in place over electrically conductive fastening unit (14). As shown in FIG. 5, aperture (23) has a contact region (24) associated with it. Contact region (24) is adapted to make mechanical and electrical contact with electrically conductive fastening unit (14). In this embodiment, contact region (24) has a fluted structure. Contact region (24) is deflectable. That is, upon the application of downward pressure (in the direction of the arrow A in FIG. 5, and applied, for example, to the flange (22) area surrounding the aperture (23) using simple tooling such as a hollow metal tube), contact region (24) deflects outwardly (in the direction of arrow B in FIG. 5) to fit over electrically conductive fastening unit (14). As a result, contact region (24) achieves the position shown in FIG. 6. Upon the application of further downward pressure, flange (22), including aperture (23) and contact region (24), snap into the position shown in FIG. 7. In this position, contact region (24) is thus in secure mechanical engagement by interference contact with electrically conductive fastening unit (14), such that electrically conductive fastening unit (14) is retained by contact region (24). In this manner, shield (20) is retained in position over PCB (10).

Shield (20) may be made in part from a dielectric material, filled dielectric material, metal, metal foil, metal-plated or coated dielectric material, or a combination thereof. While several forming methods exist for such a shield (20), thermoforming or vacuum forming are preferred methods for working with plastics, because of their low tooling costs, low manufacturing costs, and ability to form complex shield shapes in three dimensions. The most preferred material for shield (20) is a plastic material such as polycarbonate, acrylonitrile-butadiene-styrene (ABS), ABS-polycarbonate blend, polyetherimide, polytetrafluoroethylene, or expanded polytetrafluoroethylene, any of which is plated, coated, or laminated with a high-conductivity metal such as aluminum, nickel, copper, silver, tin, or combinations or alloys thereof.

Figure 8A:
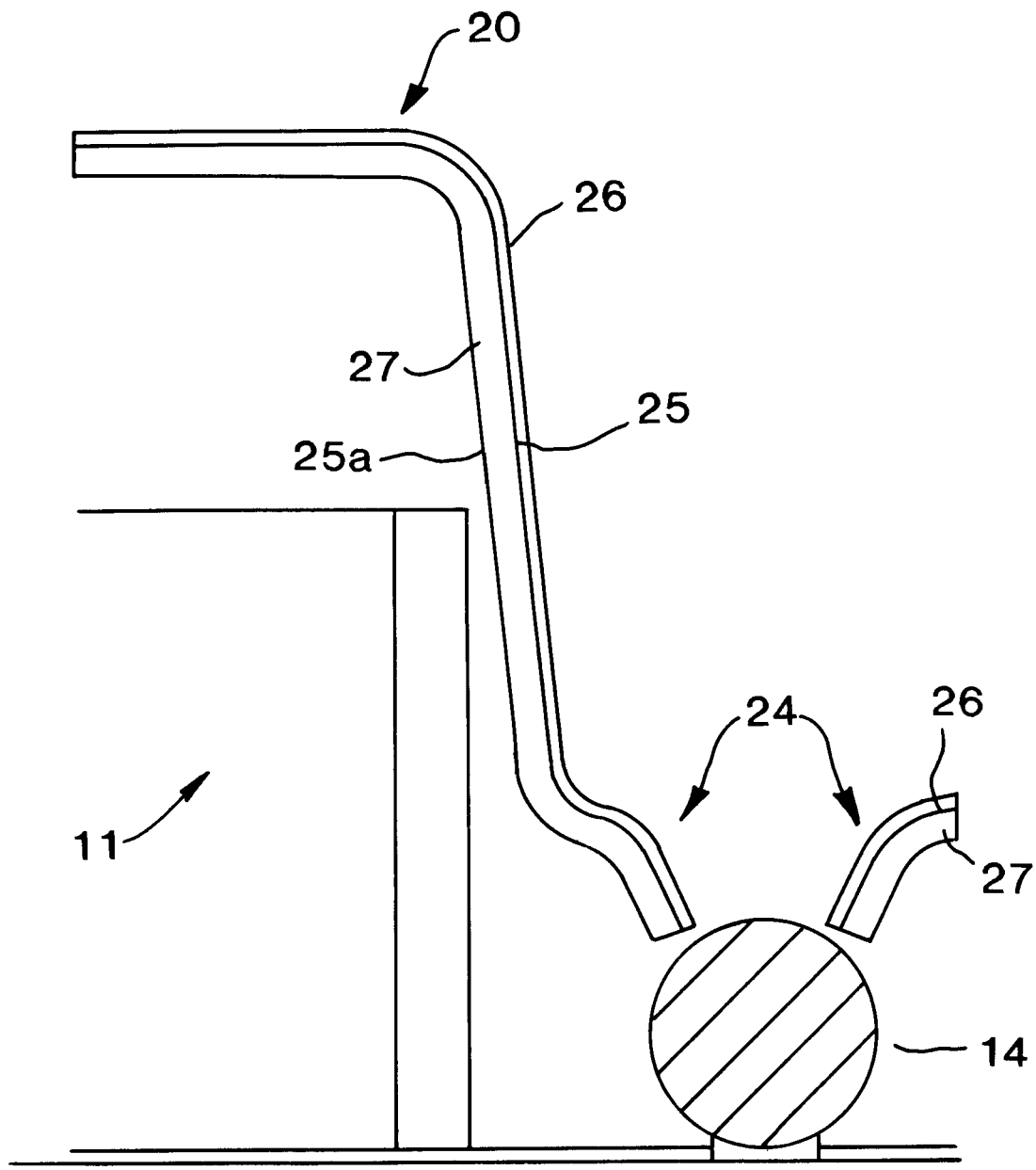
FIG. 8A is a cross-sectional view taken along A—A of FIG. 1.

As shown in FIG. 8A, in a preferred embodiment, shield (20) is actually constructed of two layers, a dielectric material layer (27) and an electrically conductive layer (26). Dielectric material layer (27) has an inner surface (25a) and an outer surface (25). Electrically conductive layer (26) is disposed over at least part of outer surface (25). Dielectric material layer (27) is any material with very low electrical conductivity (for example, less than one-millionth mho/cm). Electrically conductive layer (26) is preferably formed by a process such as sputtering, vacuum or vapor deposition, electroless plating, or electrolytic plating. Electrically conductive layer (26) is alternatively a foil laminated to outer surface (25). This two-layer arrangement is particularly advantageous since it reduces or eliminates the possibility of inner surface (25a) from making unwanted electrical contact with any components (11) on the PCB (10), even though mechanical contact may still occur. This allows for elimination of any large gaps under shield (20), which can consume valuable space in the volume of the electronic device, thereby permitting the design to be smaller. Electrically conductive layer (26) may be any material adapted to make electrical contact with electrically conductive fastening unit (14), once shield (20) is snapped in place over electrically conductive fastening unit (14) as shown in FIG. 8B.

Figure 8B:
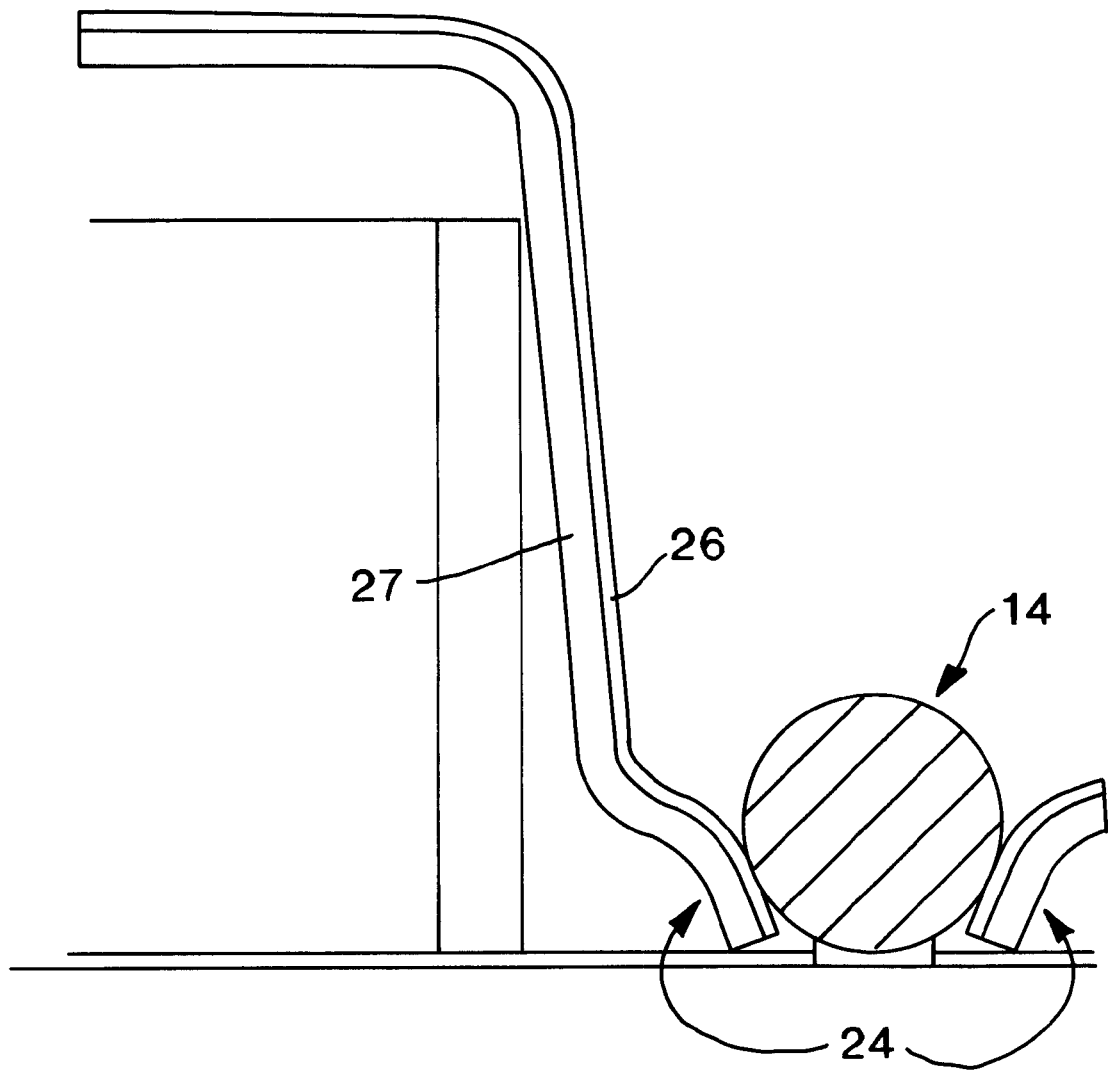
FIG. 8B is a cross-sectional view taken along A—A of FIG. 1.

With reference to FIGS. 5 through 8B, it is seen that electrically conductive layer (26) and dielectric material layer (27) of shield (20) at contact region (24) of aperture (23) are deflectable to the extent necessary to allow flange (22) to engage and mechanically retain electrically conductive fastening unit (14). In addition, electrically conductive layer (26) of shield (20) at contact region (24) is in electrical contact with electrically conductive fastening unit (14) when shield (20) is snapped in place as shown in FIG. 8B.

Figure 9A:
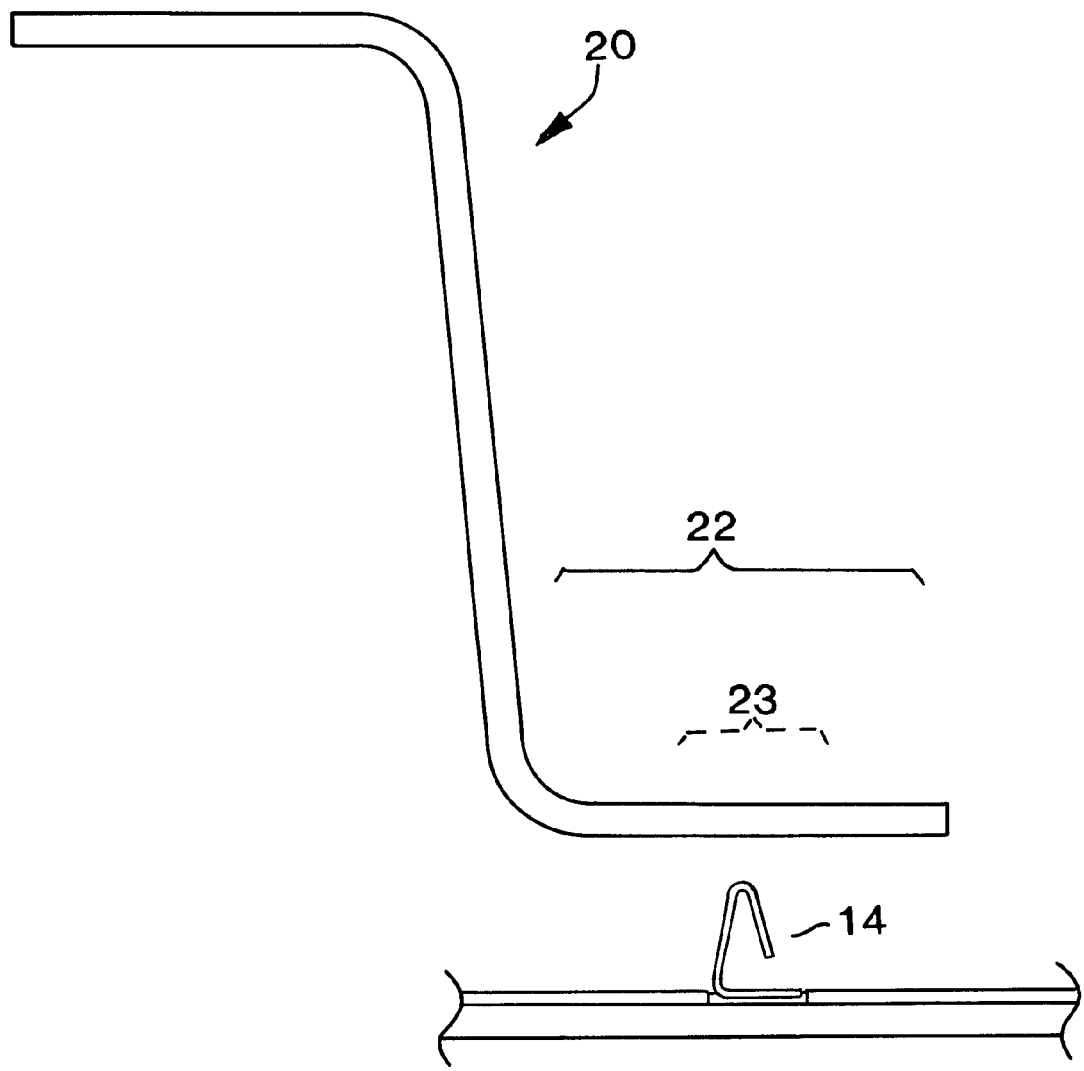
FIG. 9A is a cross-sectional view taken along A—A of FIG. 1.
Figure 9B:
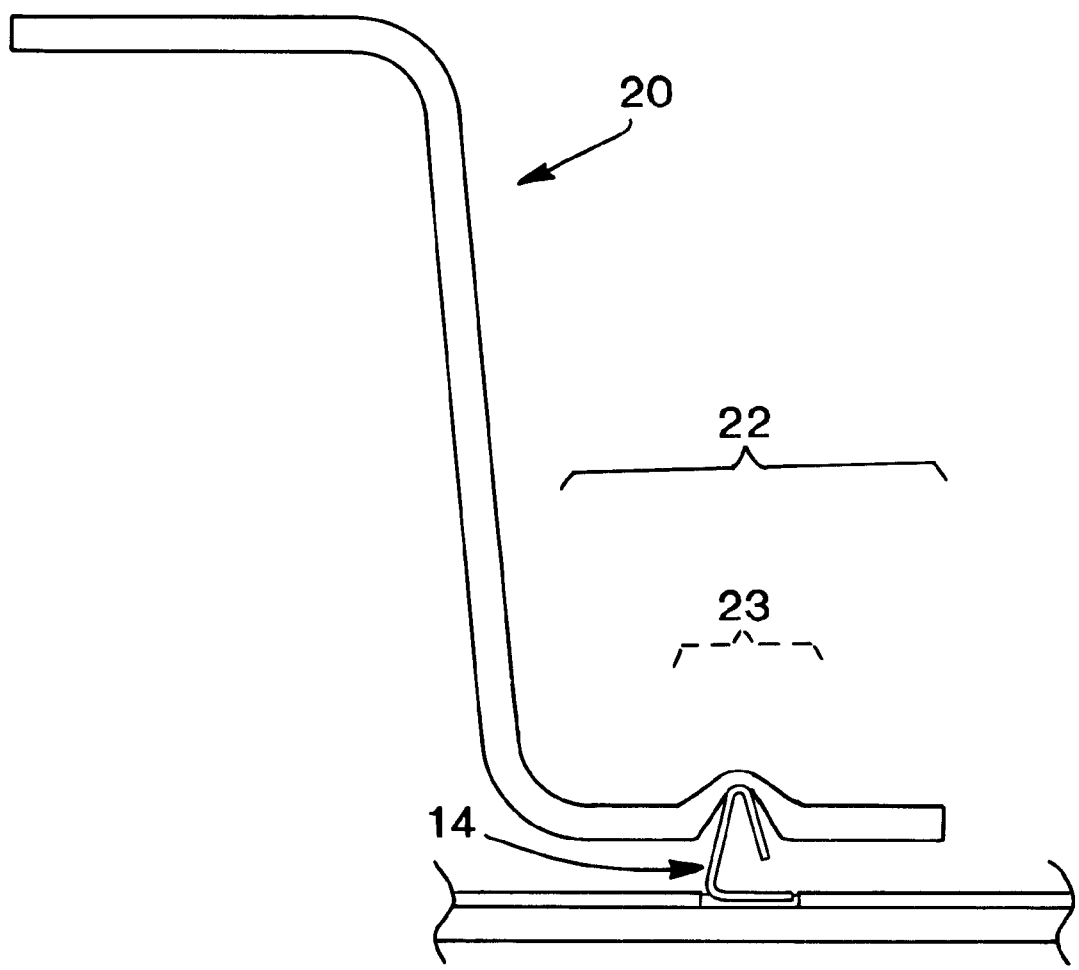
FIG. 9B is a cross-sectional view taken along A—A of FIG. 1.
Figure 9C:
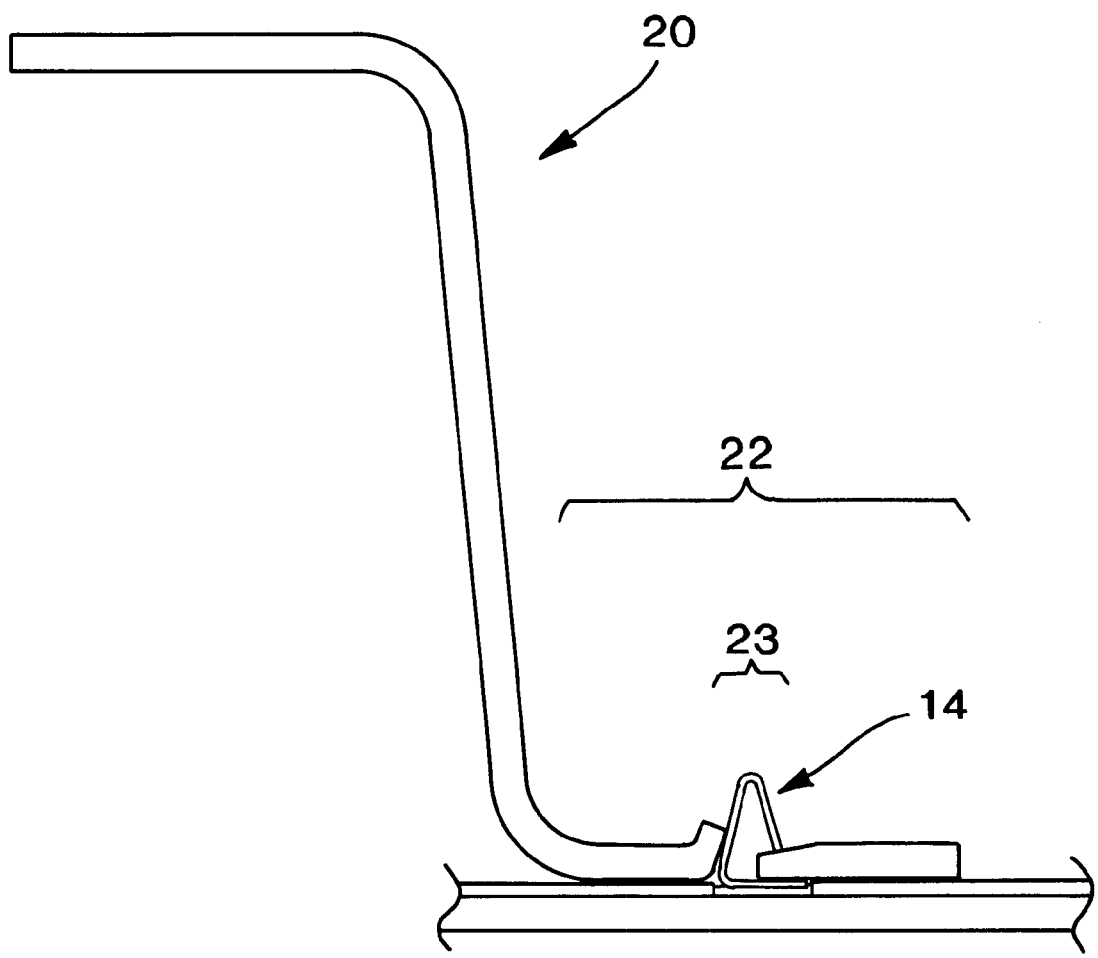
FIG. 9C is a cross-sectional view taken along A—A of FIG. 1.

In an alternative embodiment, aperture (23) is larger than electrically conductive fastening unit (14) to start, but re-formed to be smaller after electrically conductive fastening unit (14) passes through it. Aperture (23) thus constricts around electrically conductive fastening unit (14), thereby deflecting contact region (24). In another alternative embodiment illustrated in FIGS. 9A, 9B, and 9C, electrically conductive fastening unit (14) actually forms aperture (23) in flange (22) in-situ as it pierces and then passes through flange (22). FIG. 9A shows the shield (20) and flange (22) prior to the aperture (23) being formed, FIG. 9B shows the aperture (23) in the process of being formed by the electrically conductive fastening unit (14) piercing through the flange (22) and FIG. 9C shows the aperture (23) fully-formed, after the electrically conductive fastening unit (14) has passed through the flange (22).

Figure 10A:
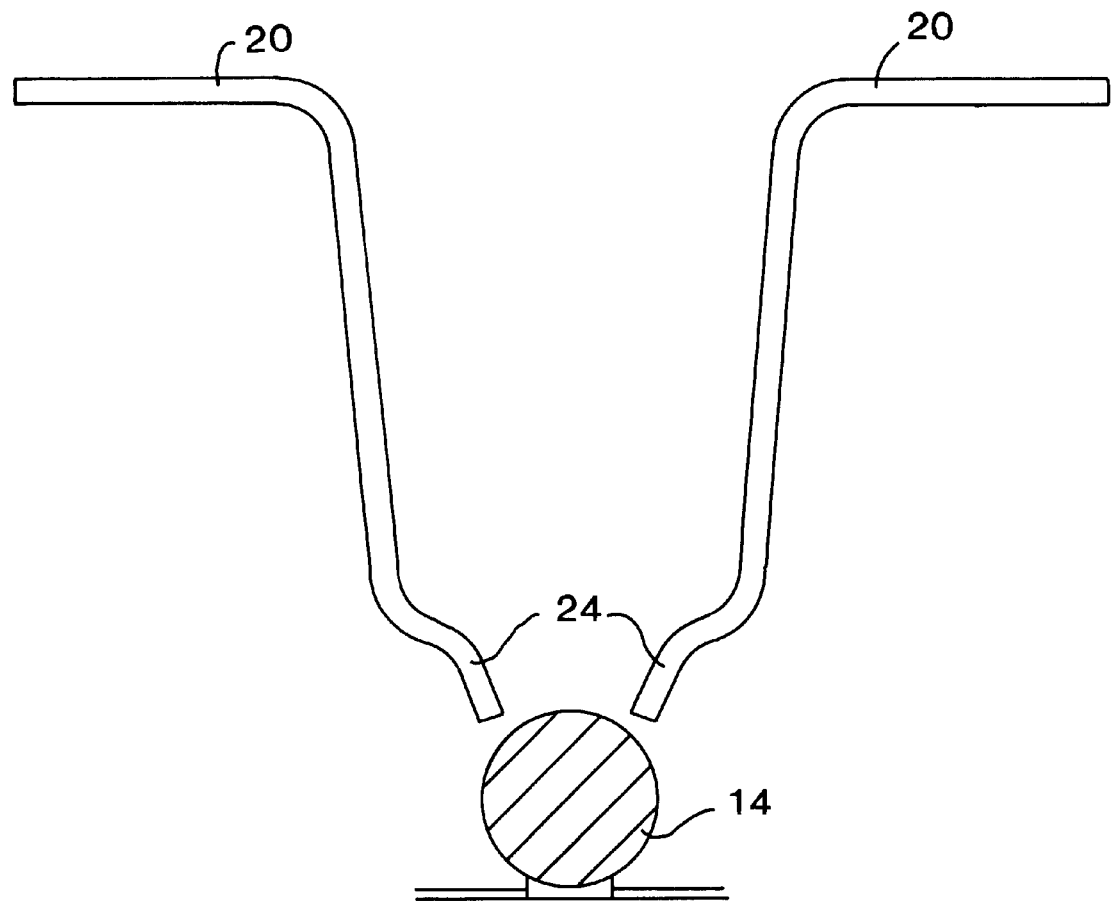
FIG. 10A is a cross-sectional view taken along C—C of FIG. 1.
Figure 10B:
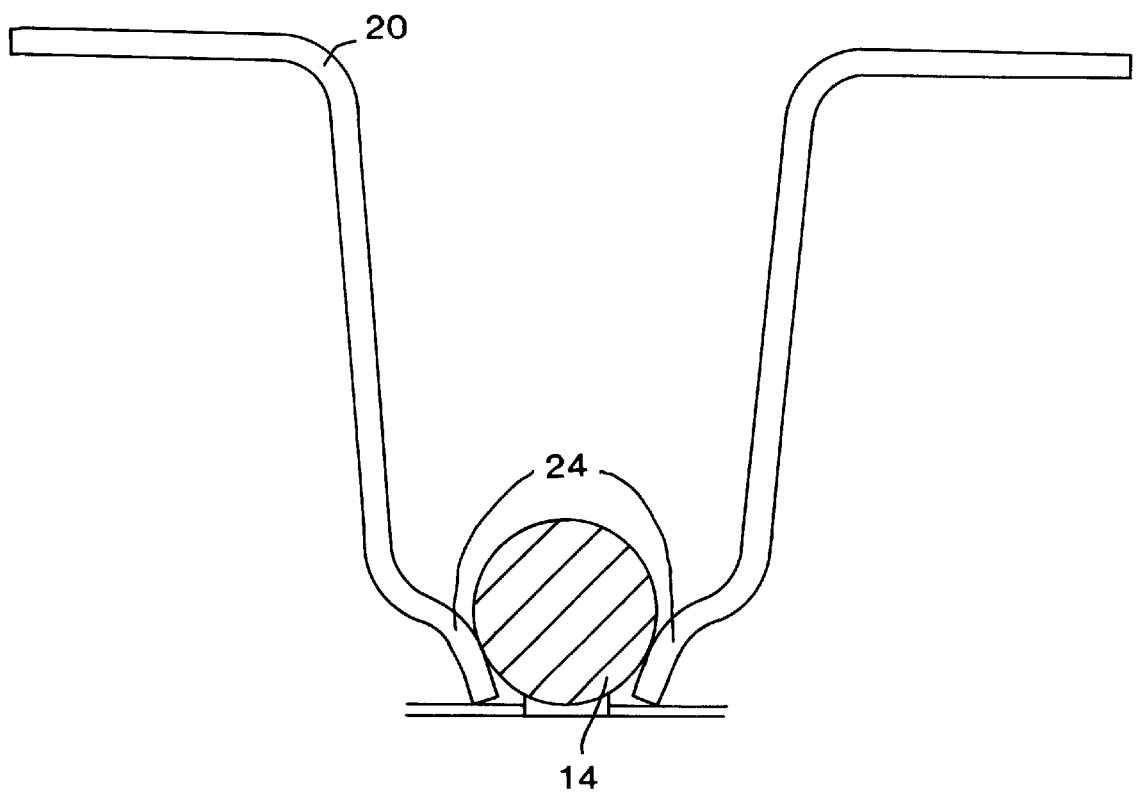
FIG. 10B is a cross-sectional view taken along C—C of FIG. 1.

FIGS. 10A and 10B show shield (20) in cross-section taken across line C—C from FIG. 1, representing an internal compartment wall of shield (20). FIG. 10A shows shield (20) immediately before being snapped over electrically conductive fastening unit (14). FIG. 10B shows shield (20) after being snapped over electrically conductive fastening unit (14).

Those skilled in the art will recognize that there are many possible variations within the scope of this invention for the design of contact region (24) for the shield (20). What is critical is that contact region (24) provides reliable mechanical retention and electrical contact with electrically conductive fastening unit (14).

The inventive apparatus must survive harsh environments for extended periods of time, which is simulated by accelerated life testing (ALT). This ALT may include severe mechanical and environmental tests such as vibration, thermal shock, thermal cycling, so the joint must be strong enough to survive without loosening or popping off. It is also desirable for the joint to survive multiple openings and closings, so that shield (20) may be reused a number of times. There are also electrical requirements that shield (20) must pass, again through ALT. The main requirement is that the electrical and mechanical connection between contact region (24) of shield (20) and electrically conductive unit (14) is as reliable as possible, and that the resistance through the joint is as low as possible. Different applications will have different requirements for such a resistance value and spacing for the joints, depending upon the needs of the system to be shielded. As such, many different designs for contact region (24) will be suitable as will be recognized by those skilled in the art and are within the scope of this invention.

Figure 11:
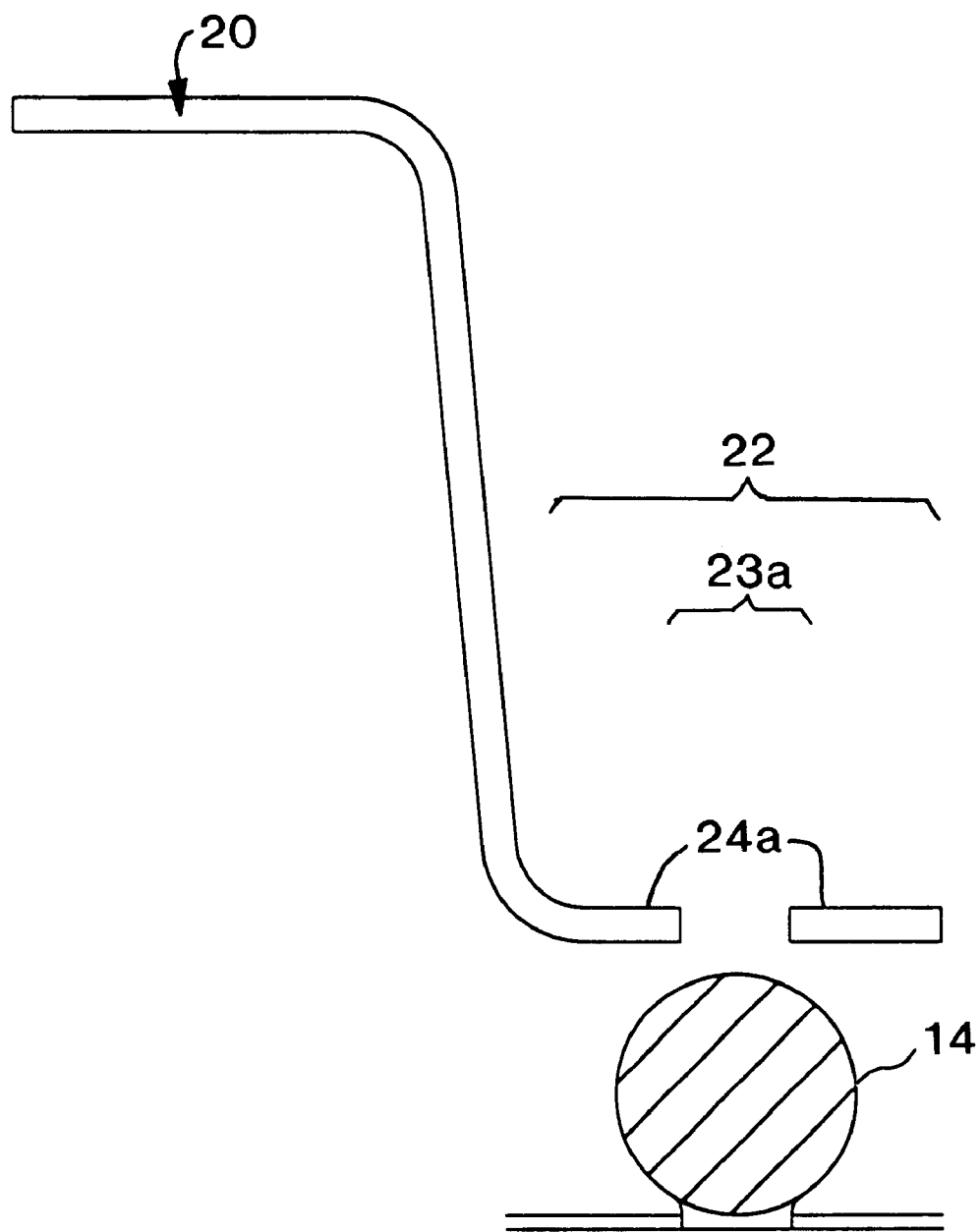
FIG. 11 is a cross-sectional view taken along A—A of FIG. 1.
Figure 12:
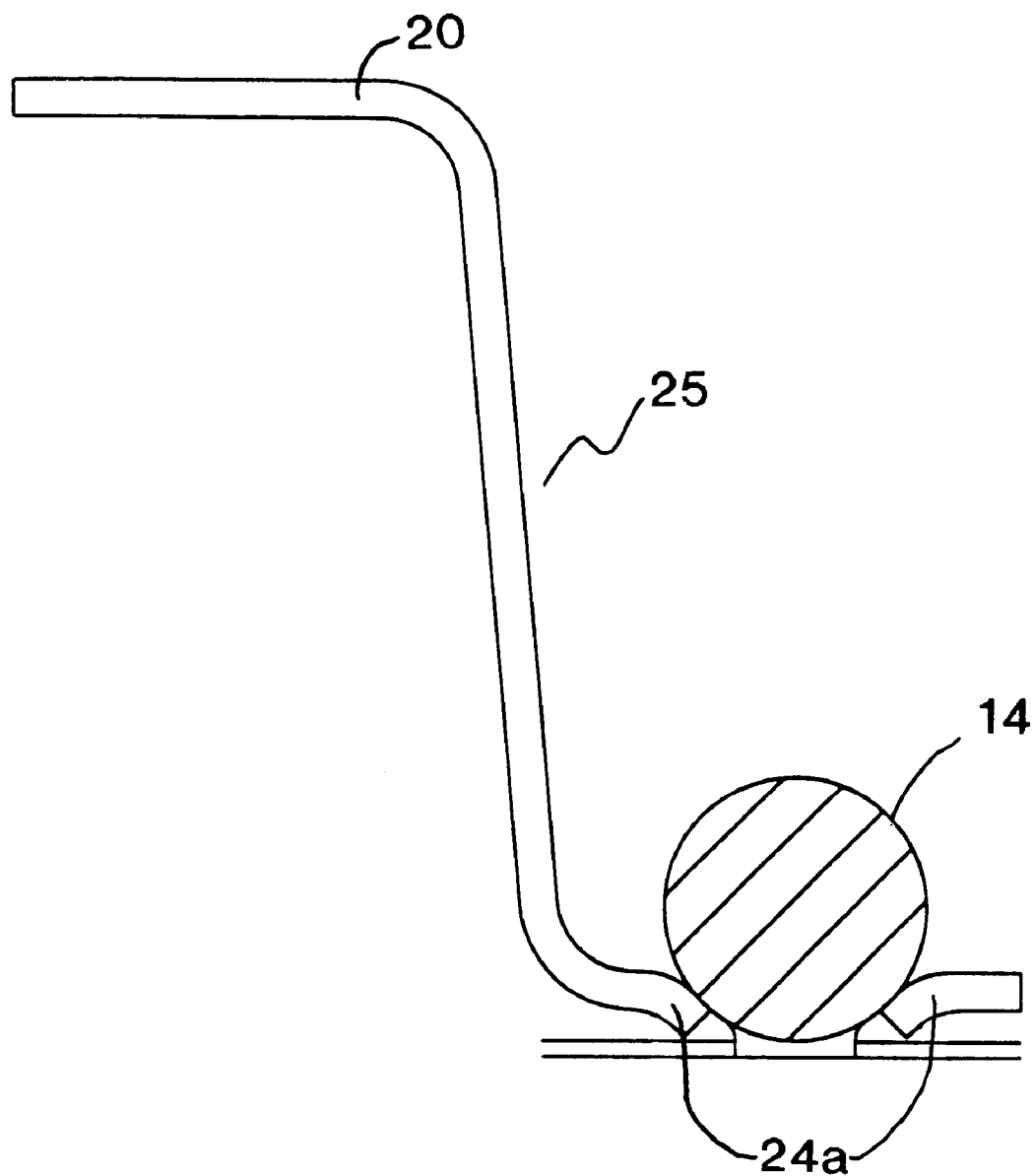
FIG. 12 is a cross-sectional view taken along A—A of FIG. 1.

An alternative embodiment for the shape of contact region (24) is shown in FIGS. 11 and 12. Contact region (24a) is simply the perimeter of an aperture (23a) in flange (22). Depending upon how shield (20) and contact region (24) are installed over electrically conductive unit (14), the contact region (24) deflects to have a fluted configuration such as that shown in FIG. 12. In this case, it is desirable for at least the outer surface (25) of shield (20) to be metalized or have a metal layer, to maintain electrical conductivity to electrically conductive unit (14).

Figure 13:
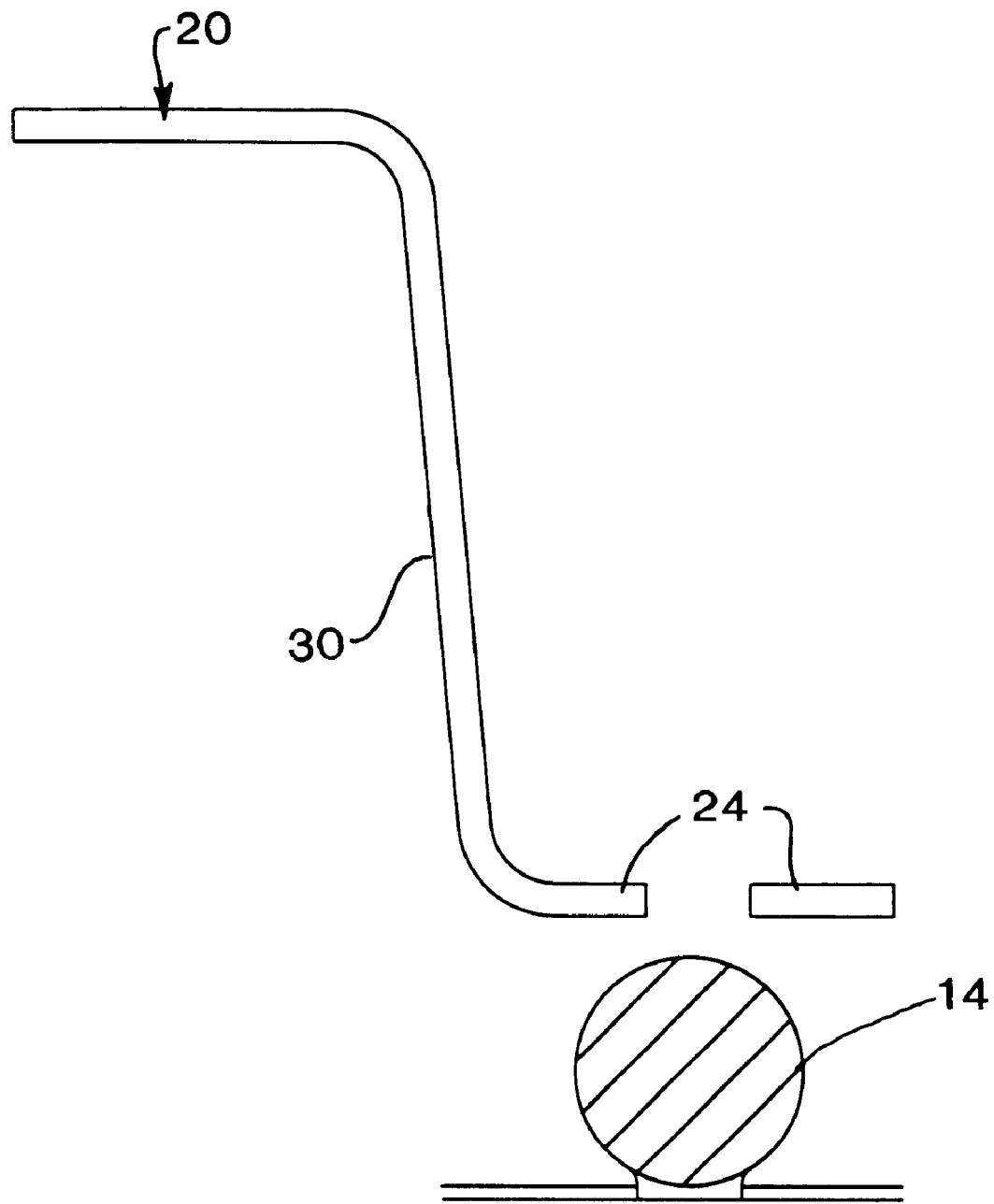
FIG. 13 is a cross-sectional view taken along A—A of FIG. 1.
Figure 14:
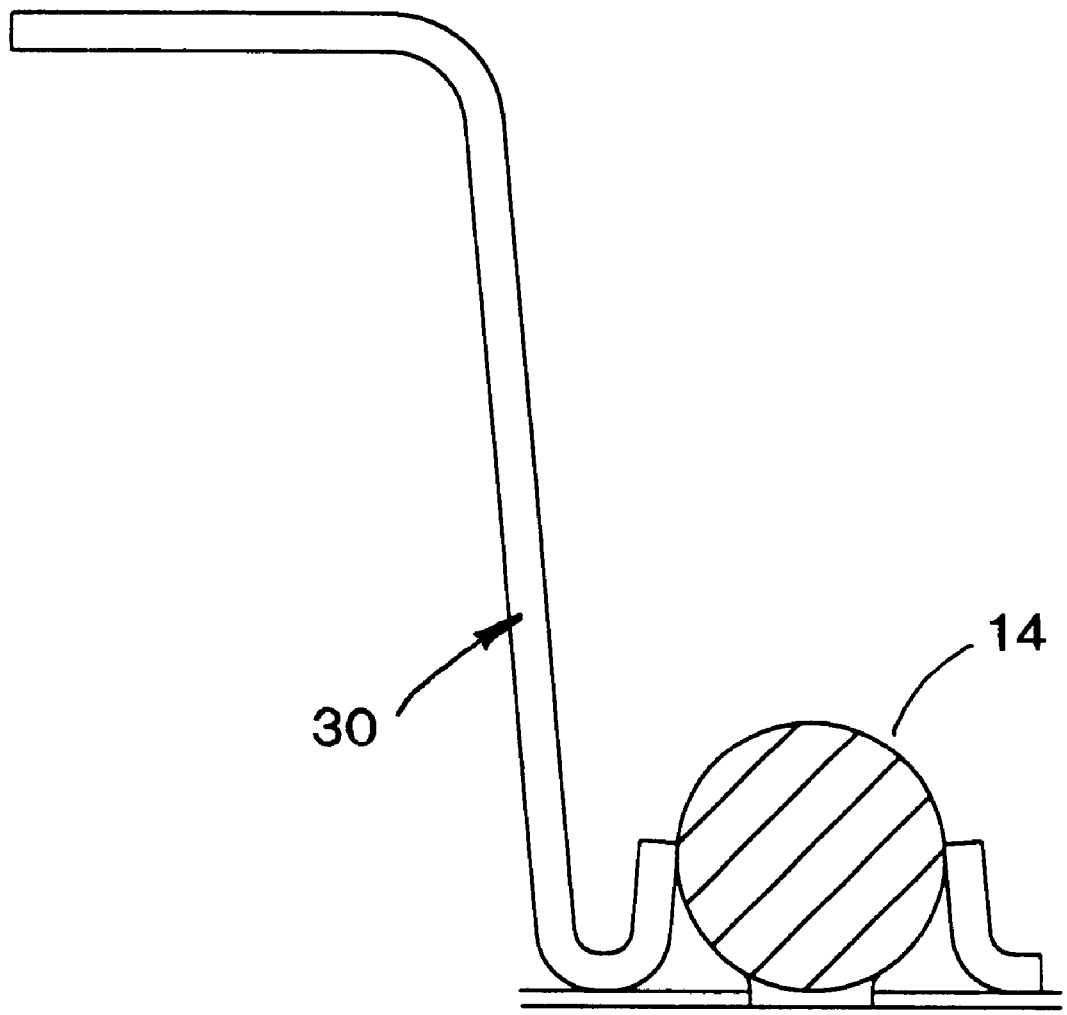
FIG. 14 is a cross-sectional view taken along A—A of FIG. 1.

A further alternative embodiment for contact region (24) is shown in FIGS. 13 and 14. In this embodiment, inner surface (30) of shield (20) is metallized or has a metal layer because it is inner surface (30) that contacts electrically conductive fastening unit (14) as shown in FIG. 14.

Figure 15A:
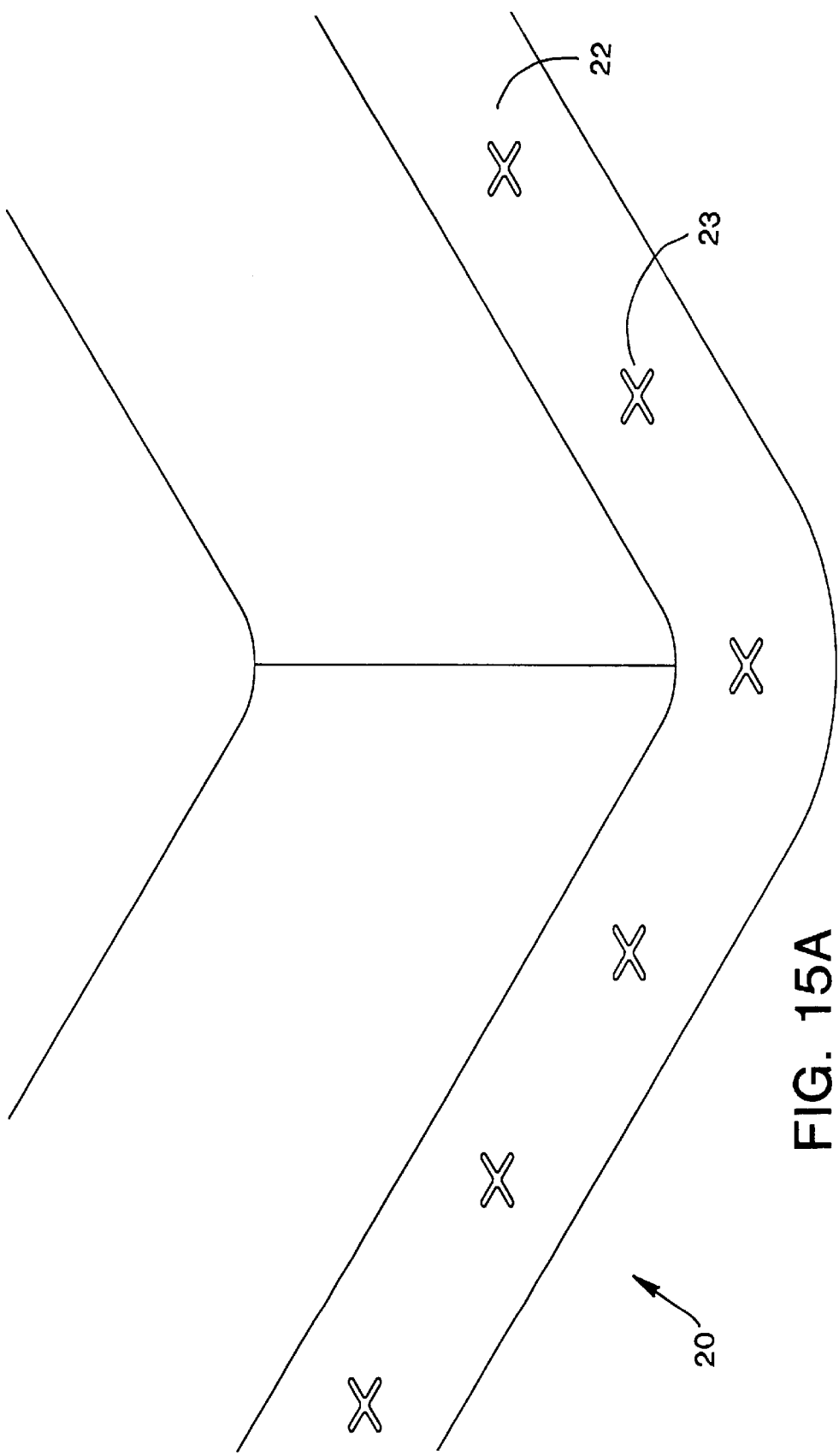
FIG. 15A is a perspective view of a shield according to another exemplary embodiment of the invention.
Figure 15B:
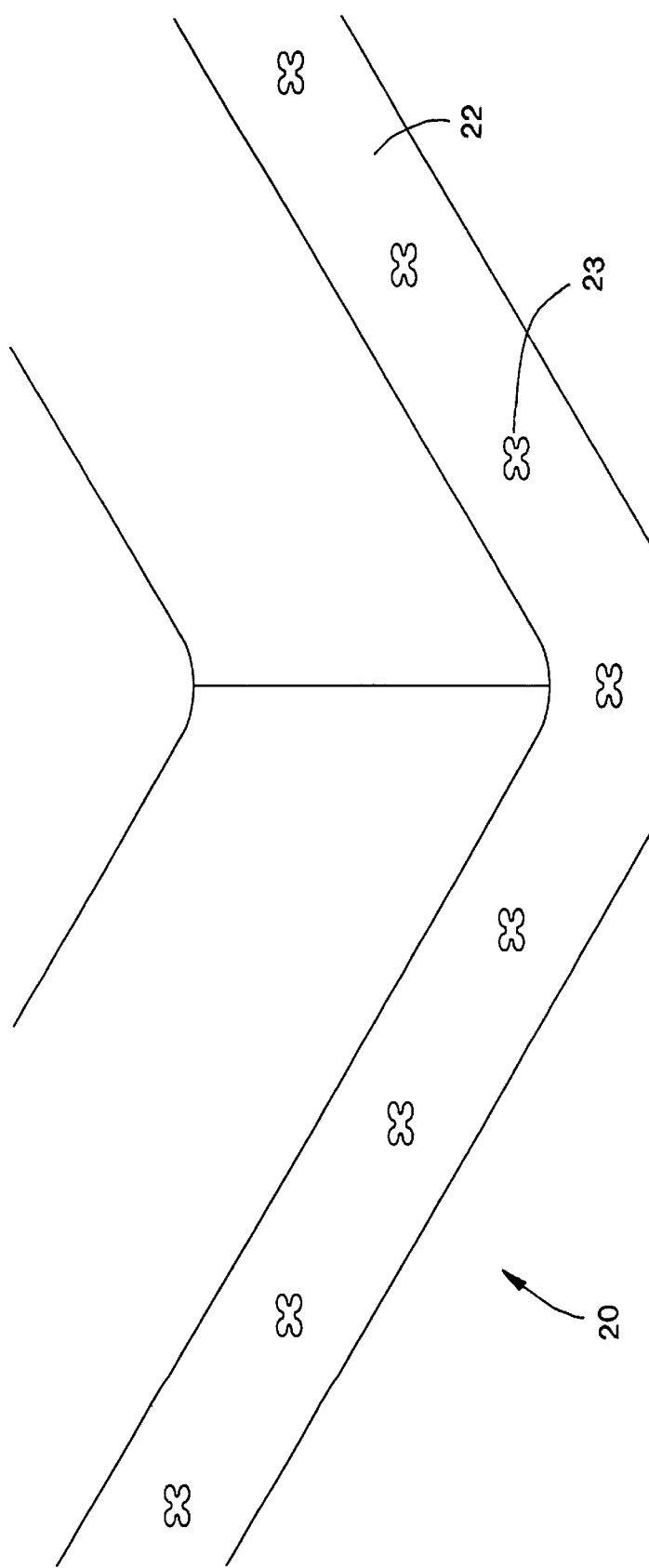
FIG. 15B is a perspective view of a shield according to another exemplary embodiment of the invention.

It is not necessary that apertures (23) in flange (22) are circular. In another alternative embodiment, apertures (23) in flange (22) are in the shape of an "X," or "cloverleaf", as shown in FIGS. 15A and 15B respectively, or other easily deflected configuration.

Another alternative embodiment is shown in FIG. 15C, in which aperture (23) is a "slot". In this case, apertures (23) in flange (22) are represented by two intersecting holes (31) and (32), the primary hole (31) which is large enough for the mating electrically conductive fastening unit (14) to pass through without deflection. Upon sliding the shield laterally, the electrically conductive fastening unit (14) engages the secondary hole (32) and contact region (24) deflects to the extent necessary to engage and retain electrically conductive fastening unit (14).

Figure 16:
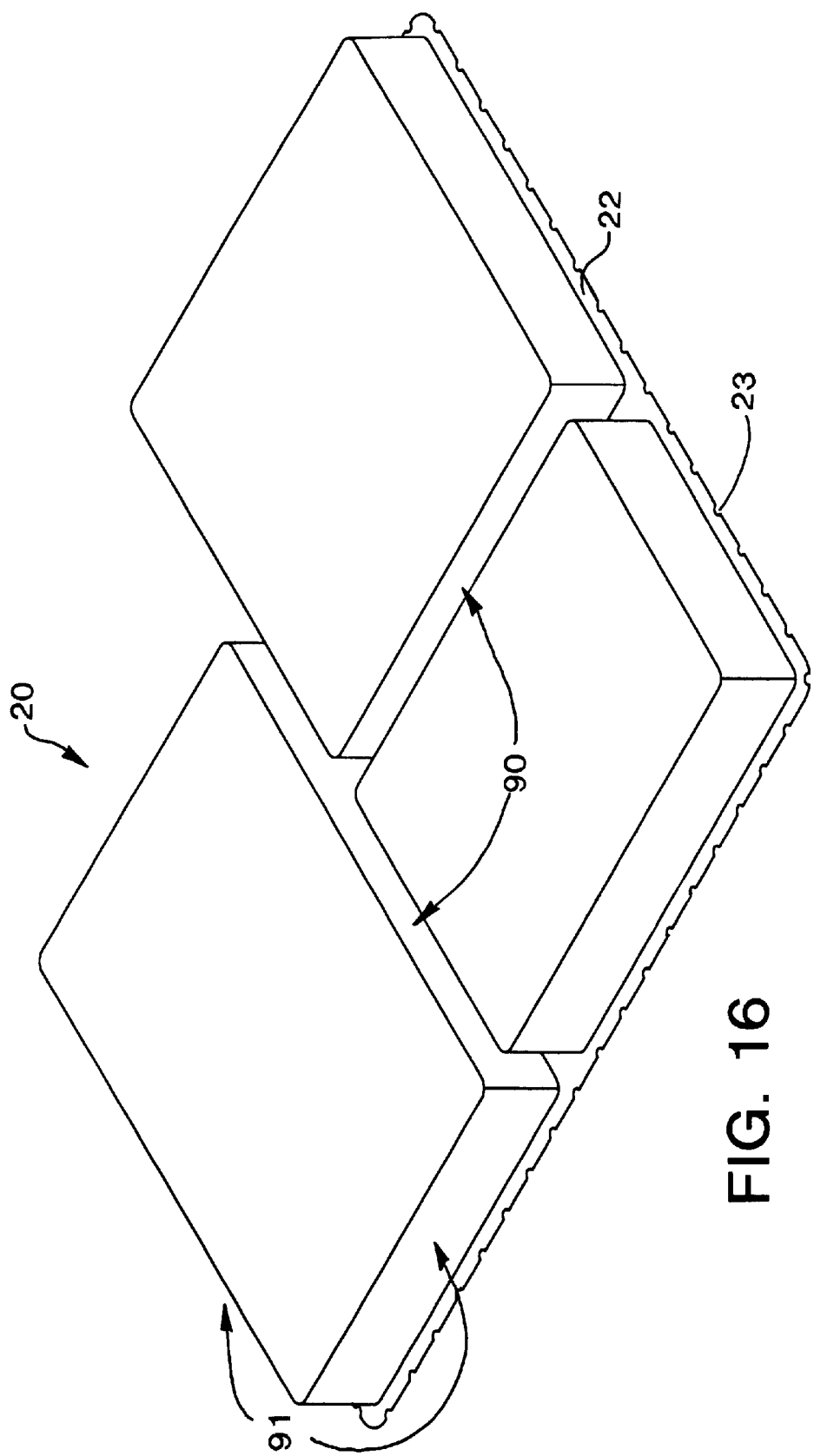
FIG. 16 is a perspective view of a shield according to another exemplary embodiment of the invention.

In another alternative embodiment, apertures (23) in flange (22) are semi-circles as shown in FIG. 16. It is also within the scope of this invention to dispense with apertures (23) in flange (22) altogether, and simply use the edge of the flange (22) itself to engage and retain the electrically conductive fastening unit (14). In these two embodiments, flange (22) along an exterior compartment wall (91) of shield (20) is deflectable to fit against and be retained by electrically conductive fastening units (14) on PCB (10). Interior compartment walls (90) can be handled using methods discussed above, or the multi-compartment shield can be separated into individual single compartment shields to accommodate this embodiment.

While particular embodiments of the present invention have been illustrated and described herein, the present invention should not be limited to such illustrations and descriptions. It should be apparent that the changes and modifications may be incorporated and embodied as part of the present invention within the scope of the following claims.

What is claimed is:
1. An apparatus comprising:
   (a) a substrate having at least one electrical component disposed thereon;
   (b) a plurality of discrete electrically conductive fastening units disposed in a pattern on said substrate surrounding said at least one electrical component;
   (c) an EMI shield comprising a dielectric material layer having an inner surface and an outer surface and an electrically conductive layer over at least one of said inner and outer surface;
   (d) a plurality of apertures formed in said EMI shield such that said apertures correspond to said pattern of said electrically conductive fastening units;
   (e) wherein at least one of said apertures has a contact region and wherein both said dielectric material layer and said electrically conductive layer of said EMI shield at said contact region of said aperture are deflectable to the extent necessary to allow said contact region to engage and retain at least one of said electrically conductive fastening units;
   (f) and wherein said electrically conductive layer of said EMI shield at said contact region is in electrical contact with at least one said electrically conductive fastening unit.

2. An apparatus as defined in claim 1 wherein at least one of said electrically conductive fastening units is a solder sphere.

3. An apparatus as defined in claim 2 wherein said substrate has a ground trace disposed on it and at least one said solder sphere is soldered to said ground trace on said substrate.

4. An apparatus as defined in claim 3 wherein at least one said solder sphere is in interference contact with said contact region of said EMI shield.

5. An apparatus as defined in claim 1 wherein said electrically conductive layer is disposed on said outer surface of said dielectric material layer.

6. An apparatus as defined in claim 5 wherein said electrically conductive layer is selected from the group consisting of aluminum, tin, gold, nickel, silver, copper and combinations and alloys thereof.

7. An apparatus as defined in claim 1 wherein said electrically conductive layer is foil.

8. An apparatus as defined in claim 1 wherein said electrically conductive layer is formed by a process selected from the group of sputtering, vacuum or vapor deposition, electroless plating, and electrolytic plating.

9. An apparatus as defined in claim 1 wherein said substrate has a plurality of electrical components and said EMI shield further comprises a plurality of compartments adapted to cover said plurality of electrical components.

10. An apparatus as defined in claim 1 wherein said aperture is formed as said electrically conductive fastening unit penetrates said EMI shield.

11. An EMI shield for a substrate having at least one electrical component disposed thereon and a plurality of discrete electrically conductive fastening units disposed in a pattern on the substrate surrounding the at least one electronic component, said EMI shield comprising:
   (a) a dielectric material layer having an inner surface and an outer surface;
   (b) an electrically conductive layer over at least one of said inner and outer surface;
   (c) a plurality of apertures formed in said shield such that said apertures correspond to the pattern of the electrically conductive fastening units;
   (d) wherein at least one of said apertures has a contact region and wherein both said dielectric material layer and said electrically conductive layer of said shield at said contact region of said aperture are deflectable to the extent necessary to allow said contact region to engage and retain at least one of said electrically conductive fastening units; and
   (e) wherein said electrically conductive layer of said EMI shield at said contact region is in electrical contact with at least one said electrically conductive fastening unit.

12. An EMI shield as defined in claim 11 wherein said electrically conductive layer is disposed on said outer surface of said dielectric material layer.

13. An EMI shield as defined in claim 12 wherein said electrically conductive layer is selected from the group consisting of aluminum, tin, gold, nickel, silver, copper and combinations and alloys thereof.

14. An EMI shield as defined in claim 11 wherein said electrically conductive layer is foil.

15. An EMI shield as defined in claim 11 wherein said electrically conductive layer is formed by a process selected from the group of sputtering, vacuum or vapor deposition, electroless plating, and electrolytic plating.

16. An EMI shield as defined in claim 11 wherein said substrate has a plurality of electrical components and said shield further comprises a plurality of compartments adapted to cover said plurality of electrical components.

17. An EMI shield as defined in claim 11 wherein at least one of said apertures is formed as at least one of said electrically conductive fastening units penetrates said EMI shield.

18. An apparatus comprising:
   (a) a substrate having at least one electrical component disposed thereon;
   (b) a plurality of discrete electrically conductive fastening units disposed in a pattern on said substrate surrounding said at least one electrical component;
   (c) an EMI shield consisting essentially of an electrically conductive material;
   (d) a plurality of apertures formed in said EMI shield such that said apertures correspond to said pattern of said electrically conductive fastening units;
   (e) wherein at least one of said apertures has a contact region and wherein said electrically conductive material of said EMI shield at said contact region is deflectable to the extent necessary to allow said contact region to engage and retain at least one of said electrically conductive fastening units;
   (f) and wherein said electrically conductive material of said EMI shield at said contact region is in electrical contact with at least one said electrically conductive fastening unit.

19. An apparatus as defined in claim 18 wherein at least one of said electrically conductive fastening units is a solder sphere.

20. An apparatus as defined in claim 19 wherein said substrate has a ground trace disposed on it and said at least one solder sphere is soldered to said ground trace on said substrate.

21. An apparatus as defined in claim 20 wherein said at least one solder sphere is in interference contact with said contact region of said EMI shield.

22. An apparatus as defined in claim 18 wherein said electrically conductive layer is selected from the group consisting of aluminum, tin, gold, nickel, silver, copper and combinations and alloys thereof.

23. An apparatus as defined in claim 18 wherein said electrically conductive layer is foil.

24. An apparatus as defined in claim 18 wherein said electrically conductive layer is formed by a process selected from the group of sputtering, vacuum or vapor deposition, electroless plating, and electrolytic plating.

25. An apparatus as defined in claim 18 wherein said substrate has a plurality of electrical components and said EMI shield further comprises a plurality of compartments adapted to cover said plurality of electrical components.

26. An apparatus as defined in claim 18 wherein at least one of said apertures is formed as at least one of said electrically conductive fastening units penetrates said EMI shield.

27. An apparatus as defined in claim 18 wherein said electrically conductive material is a dielectric material containing conductive particles.

28. An apparatus comprising:
   (a) a substrate having at least one electrical component disposed thereon;
   (b) a plurality of solder spheres disposed on said substrate surrounding said at least one electrical component;
   (c) an EMI shield comprising at least one compartment adapted to cover said at least one electrical component, said EMI shield further comprising a dielectric material layer having an inner surface and an outer surface and an electrically conductive layer over at least one of said inner and outer surface; and
   (d) wherein said electrically conductive layer of said EMI shield is in electrical contact with at least one of said solder spheres, and wherein said EMI shield and said solder spheres combine to limit electromagnetic radiation from entering or exiting said at least one compartment.

* * * * *